US011195990B2

(12) United States Patent
Ausserlechner

(10) Patent No.: US 11,195,990 B2
(45) Date of Patent: Dec. 7, 2021

(54) HALL SENSOR DEVICE AND HALL SENSING METHOD

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/794,598

(22) Filed: Feb. 19, 2020

(65) Prior Publication Data

US 2020/0185599 A1   Jun. 11, 2020

Related U.S. Application Data

(62) Division of application No. 15/596,017, filed on May 16, 2017, now Pat. No. 10,586,915.

(30) Foreign Application Priority Data

May 30, 2016   (DE) .......................... 102016109883.3

(51) Int. Cl.
*G01R 33/07* (2006.01)
*H01L 43/04* (2006.01)
*H01L 43/06* (2006.01)

(52) U.S. Cl.
CPC .............. *H01L 43/04* (2013.01); *G01R 33/07* (2013.01); *H01L 43/065* (2013.01)

(58) Field of Classification Search
CPC ... H01L 43/065; H01L 43/04; G01R 33/0206; G01R 33/07; G01R 33/0005; G01R 33/072; G01R 33/093
See application file for complete search history.

(56) References Cited

U.S. PATENT DOCUMENTS

| 8,457,906 | B2 | 6/2013 | Ramachandran |
| 9,018,948 | B2 | 4/2015 | Ausserlechner |
| 9,915,708 | B2 * | 3/2018 | Sanfilippo ............... H01L 43/10 |

(Continued)

FOREIGN PATENT DOCUMENTS

| CN | 103576102 A | 2/2014 |
| CN | 104576917 A | 4/2015 |

(Continued)

OTHER PUBLICATIONS

Ausserlechner U., "Hall Effect Devices with Three Terminals: Their Magnetic Sensitivity and Offset Cancellation Scheme," Journal of Sensors, Apr. 5, 2016, 17 pages.

(Continued)

*Primary Examiner* — Alesa Allgood
(74) *Attorney, Agent, or Firm* — Harrity & Harrity, LLP

(57) ABSTRACT

The present disclosure relates to 3-dimensional Hall sensor devices comprising a Hall sensor element having a Hall effect region implemented in a 3-dimensional shell and comprising at least three terminals. Each terminal is connected to at least one electrical contact of the Hall effect region and each electrical contact is disposed at a different region of the 3-dimensional shell. The present disclosure further discloses spinning current/voltage schemes for offset cancellation in such 3-dimensional Hall sensor devices.

20 Claims, 19 Drawing Sheets

(56) References Cited

U.S. PATENT DOCUMENTS

| | | | |
|---|---|---|---|
| 2013/0200965 A1 | 8/2013 | Bondar | |
| 2013/0342195 A1 | 12/2013 | Ausserlechner | |
| 2014/0346579 A1 | 11/2014 | Franke | |
| 2015/0102807 A1 | 4/2015 | Eckinger et al. | |
| 2015/0362565 A1* | 12/2015 | Sanfilippo | G01R 33/0005 324/251 |
| 2016/0139214 A1 | 5/2016 | Ausserlechner et al. | |
| 2017/0345997 A1 | 11/2017 | Ausserlechner et al. | |

FOREIGN PATENT DOCUMENTS

| | | |
|---|---|---|
| CN | 105607017 A | 5/2016 |
| DE | 102014115071 A1 | 4/2015 |
| DE | 102015119945 A1 | 5/2016 |
| EP | 2551691 A1 | 1/2013 |
| JP | 2005116828 A | 4/2005 |
| JP | 2005156179 A | 6/2005 |

OTHER PUBLICATIONS

Banjevic M., et al., "2D CMOS Integrated Magnetometer Based on the Miniaturized Circular Vertical Hall Device," Solid-State Sensors, Actuators and Microsystems Conference, 2009, Transducers 2009, International, Jun. 21, 2009, 4 pages.

Popovic R.S., "The Vertical Hall-Effect Device," IEEE Electron Device Letters 5.9, Sep. 9, 1984, 2 pages.

Schott C., et al., "Integrated 3D Hall Magnetic Field Sensor," Proceedings of Transducers, vol. 99, Jun. 1999, 4 pages.

* cited by examiner

FIG. 2A
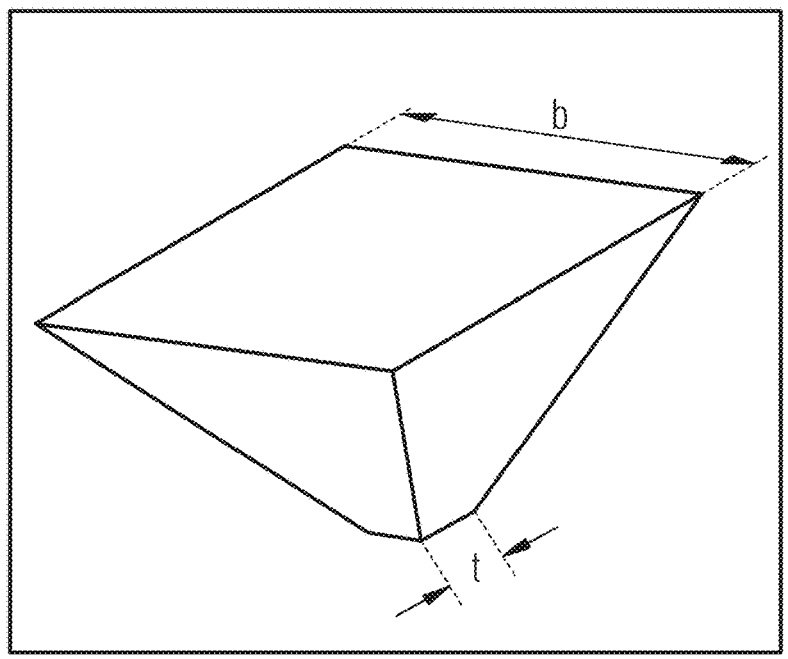
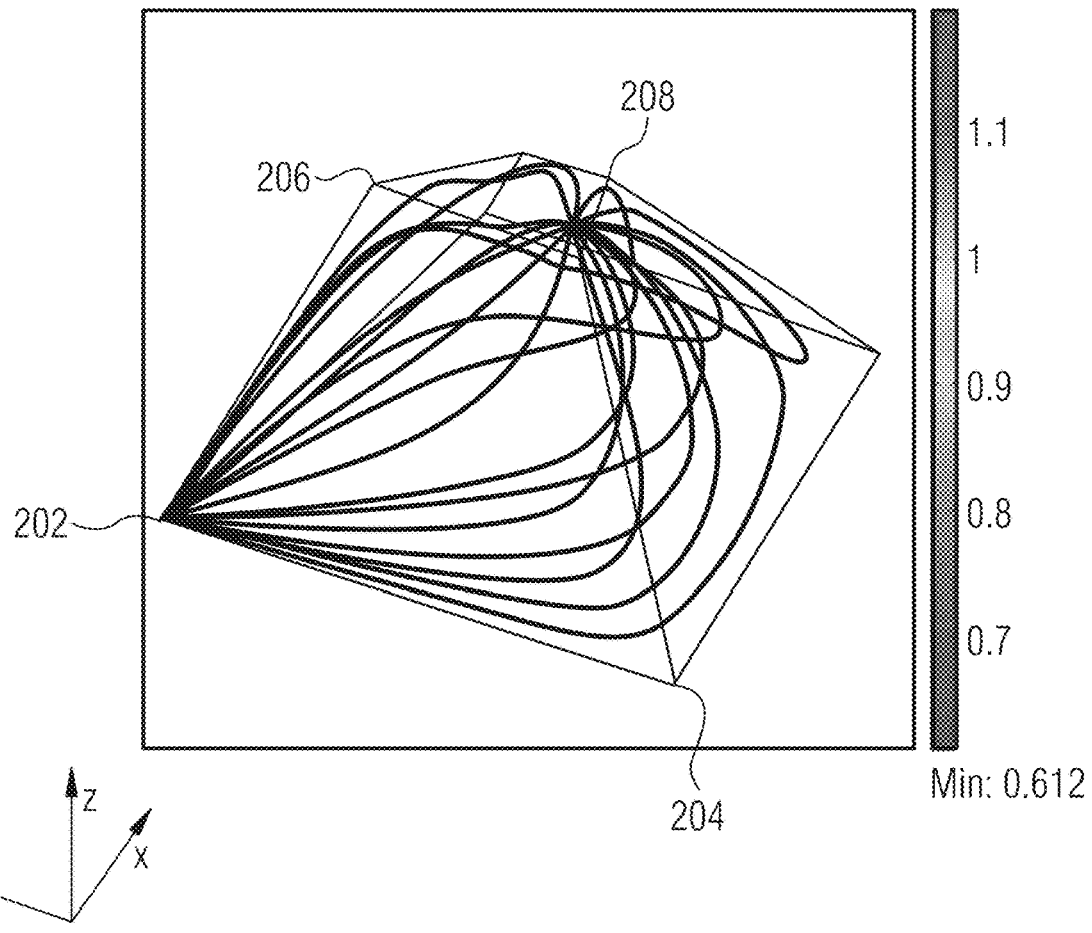

FIG. 2B
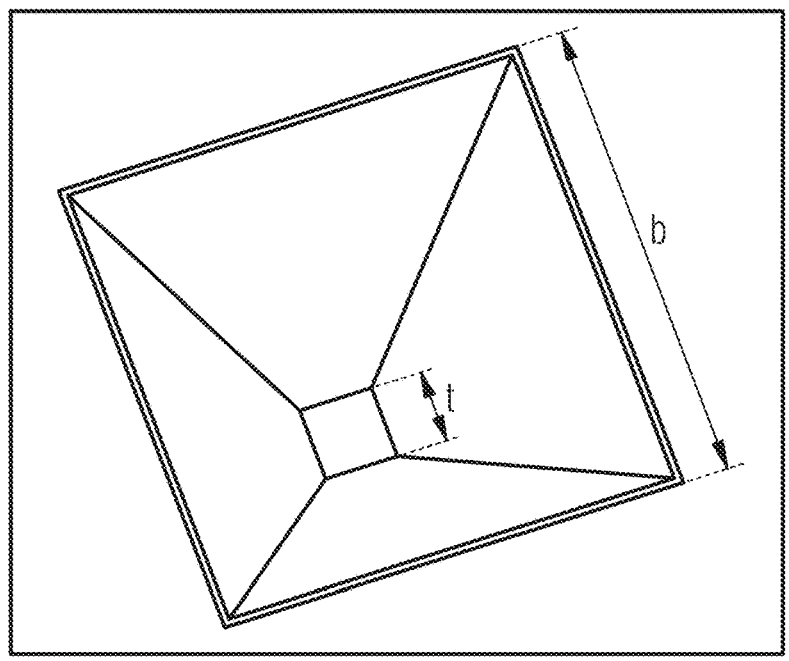
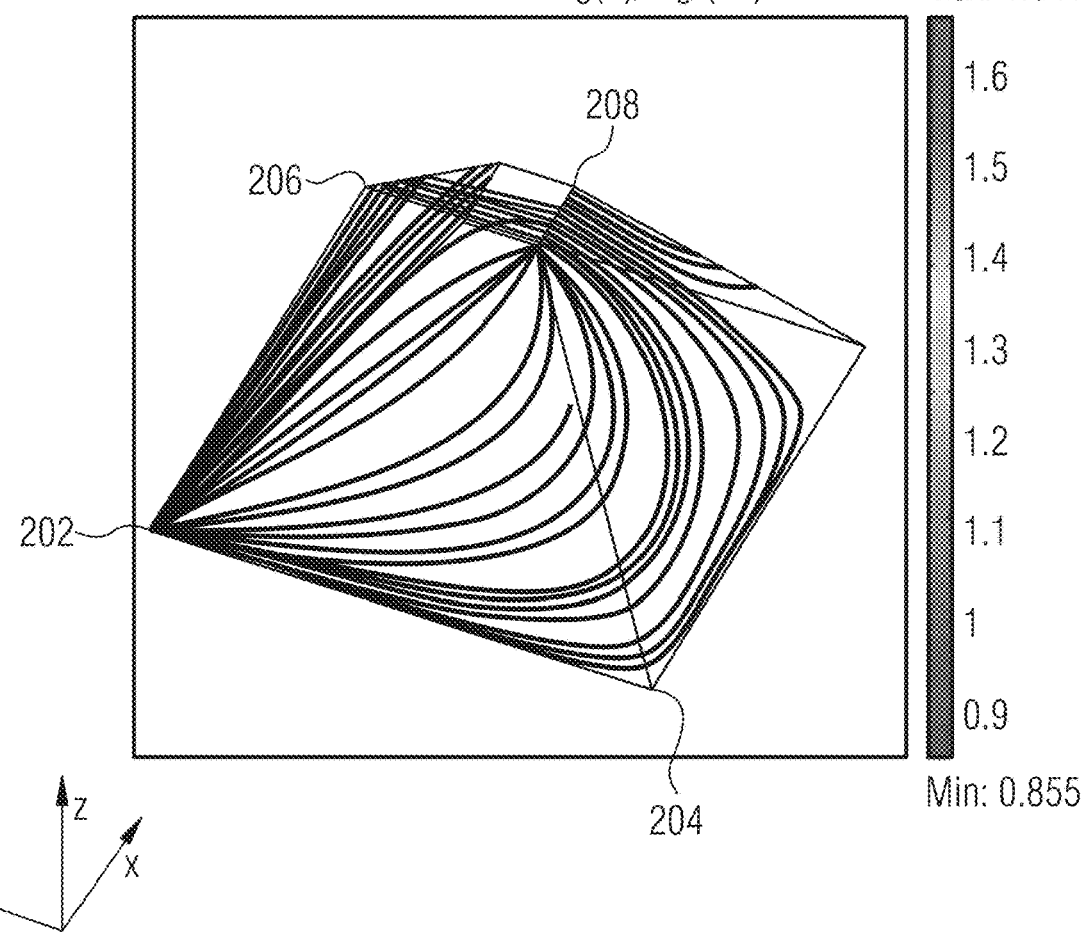
Streamline: Total current density
Streamline Color: log(V)/log/(10)

FIG. 3A
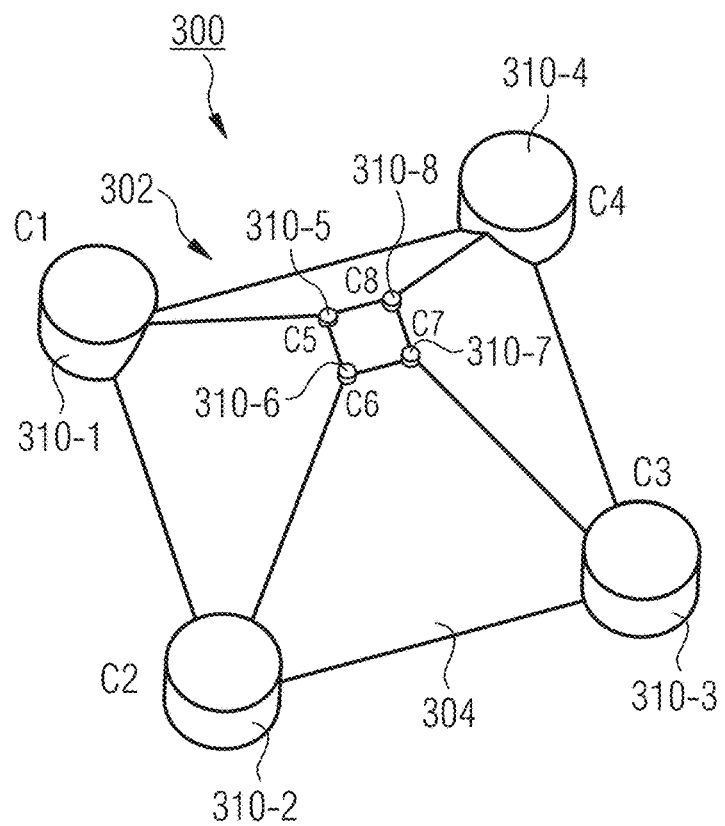
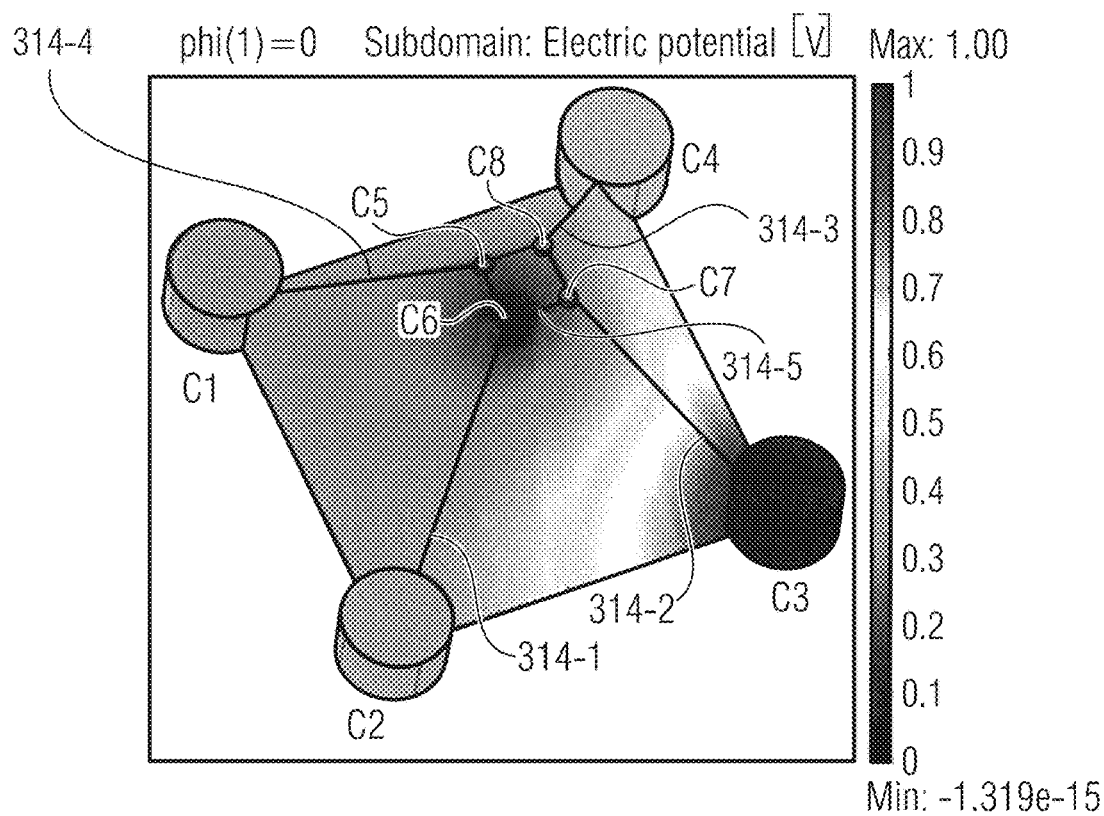

FIG. 3B
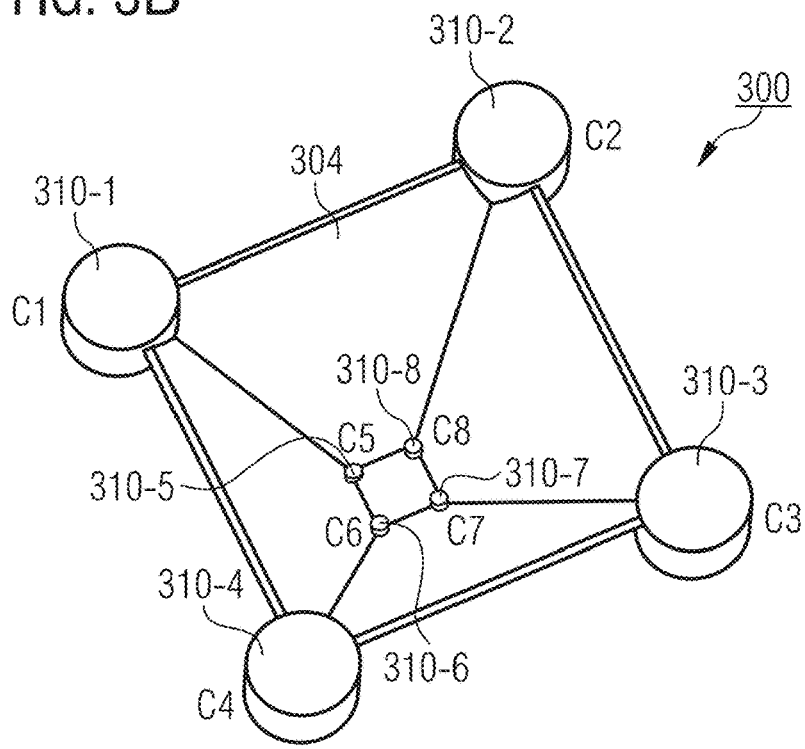
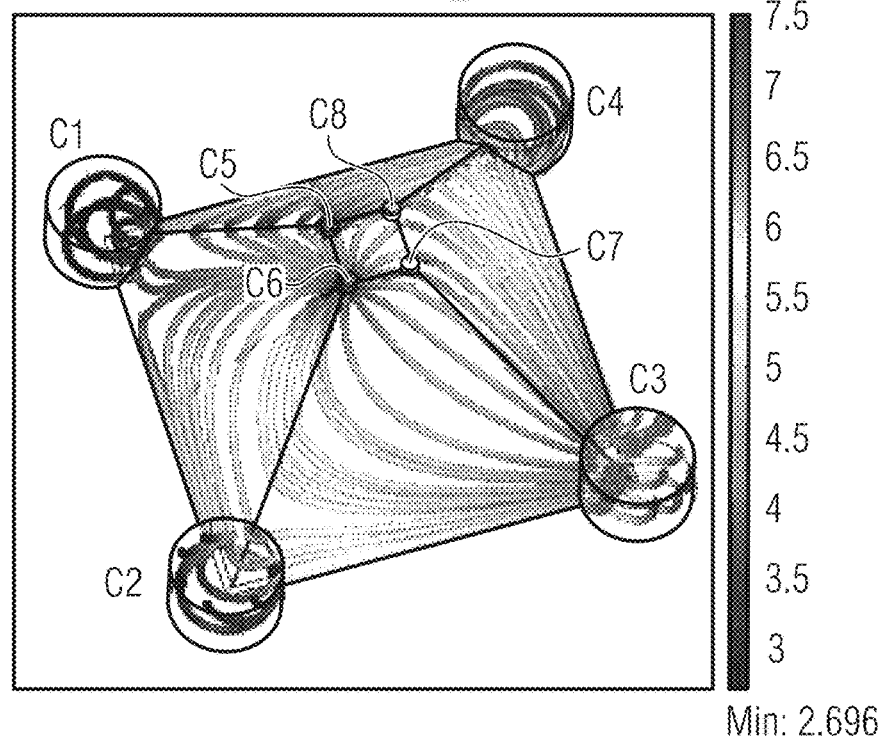
phi(1)=0   Streamline: Total current density
Streamline Color: log(normJ_emdc)/log(10)   Max: 7.507
Min: 2.696

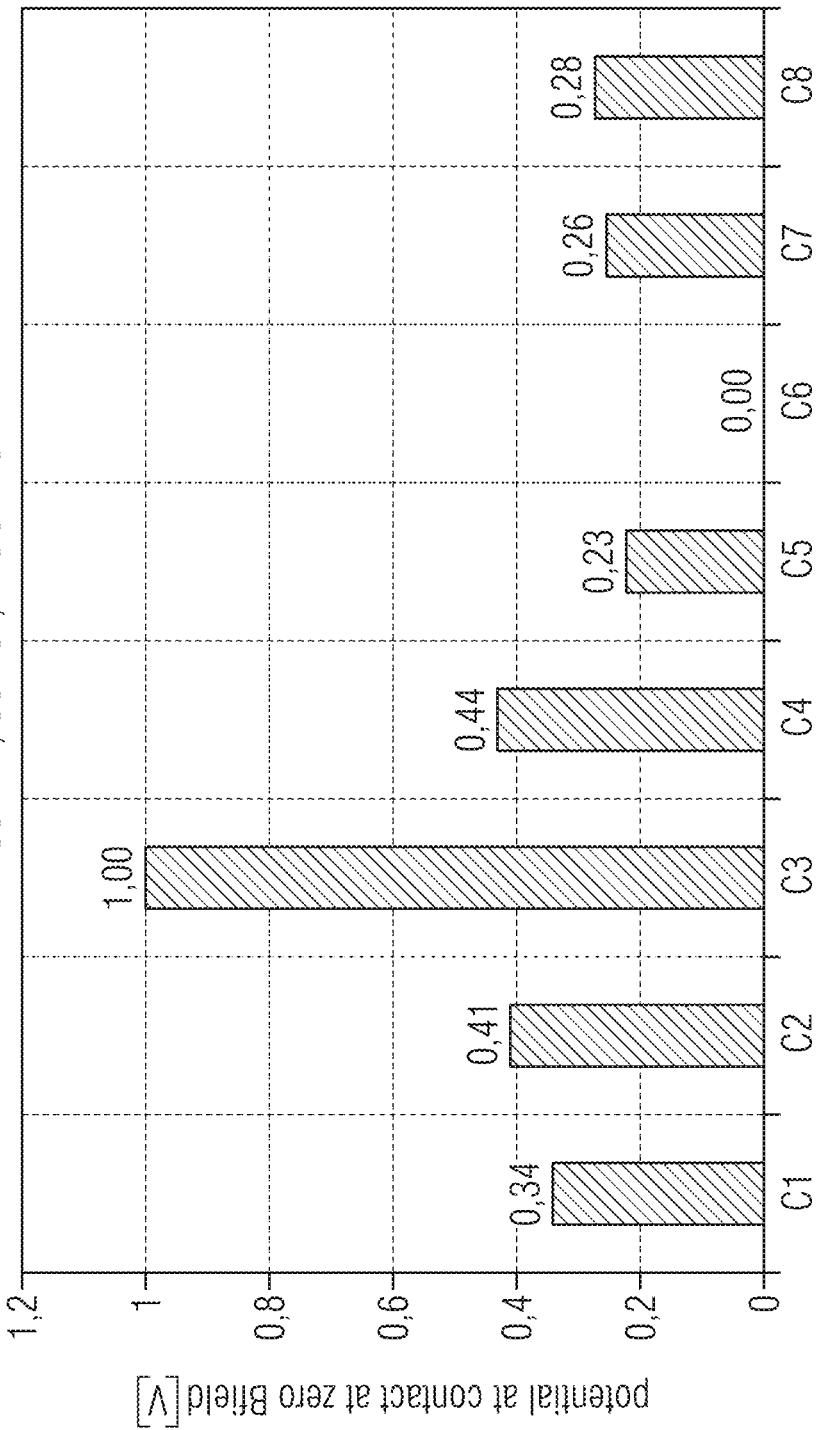

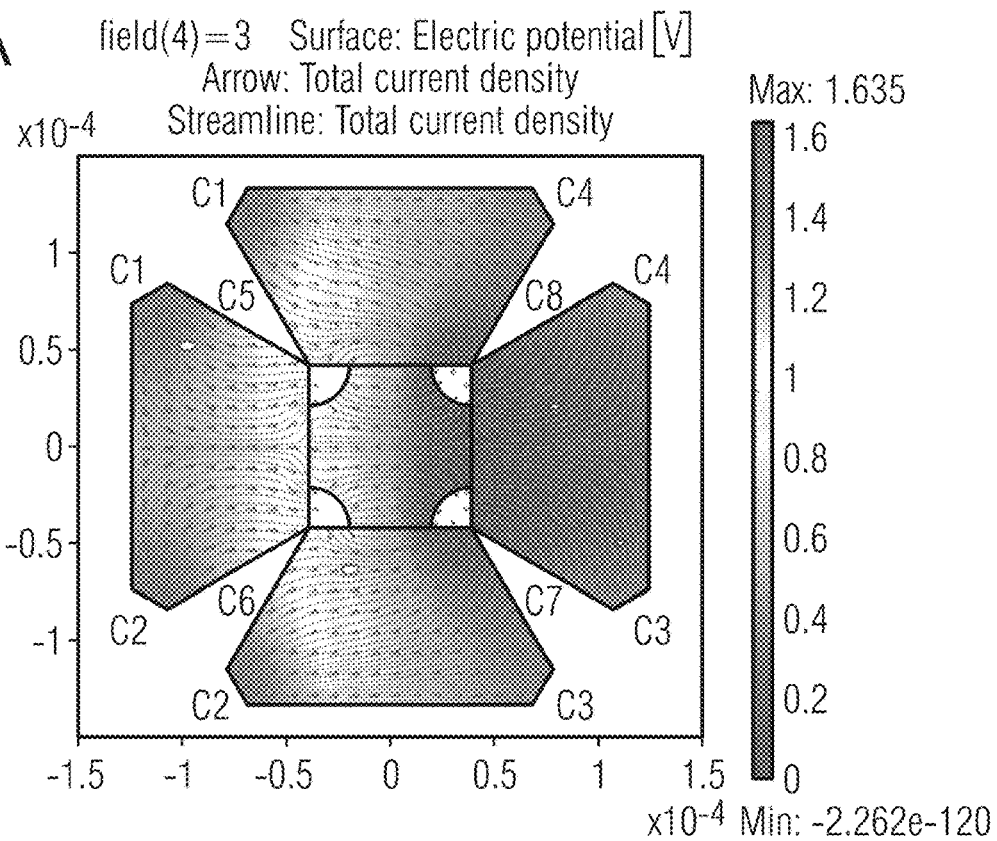
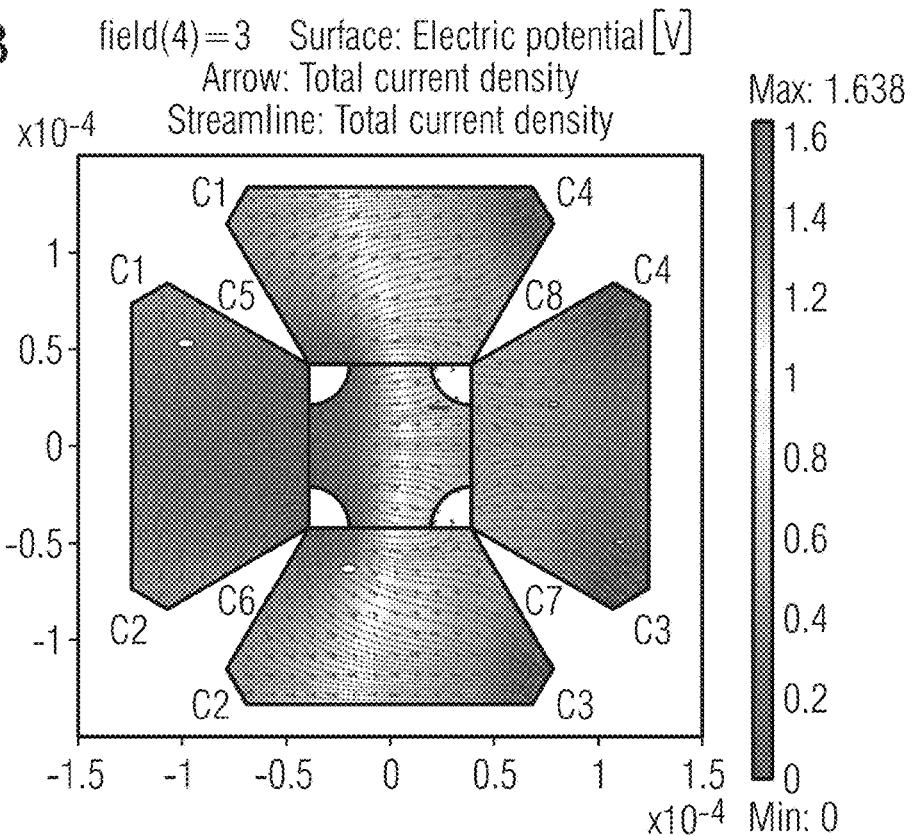

FIG. 10A
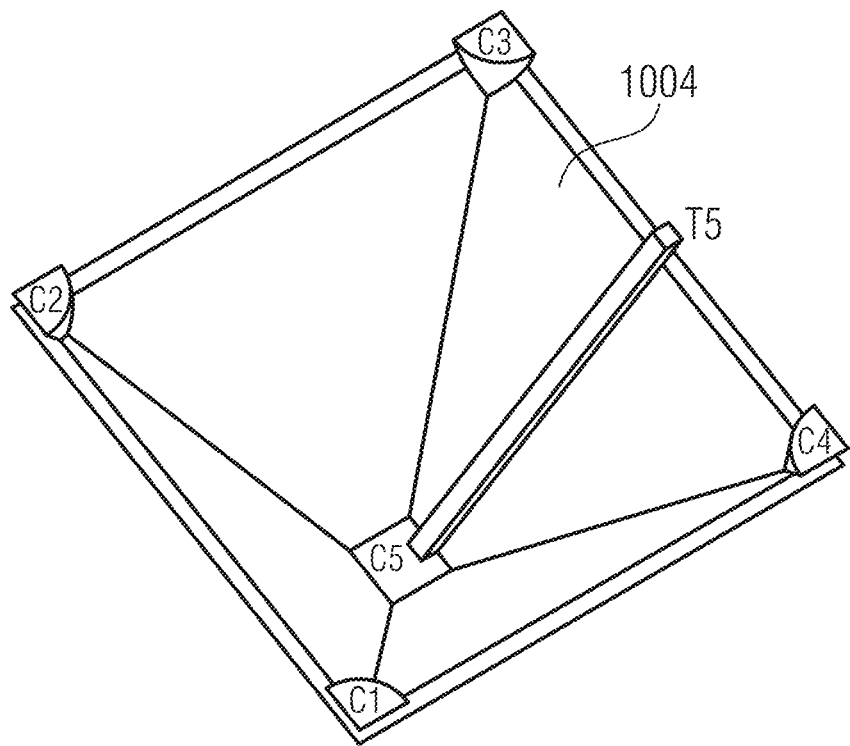
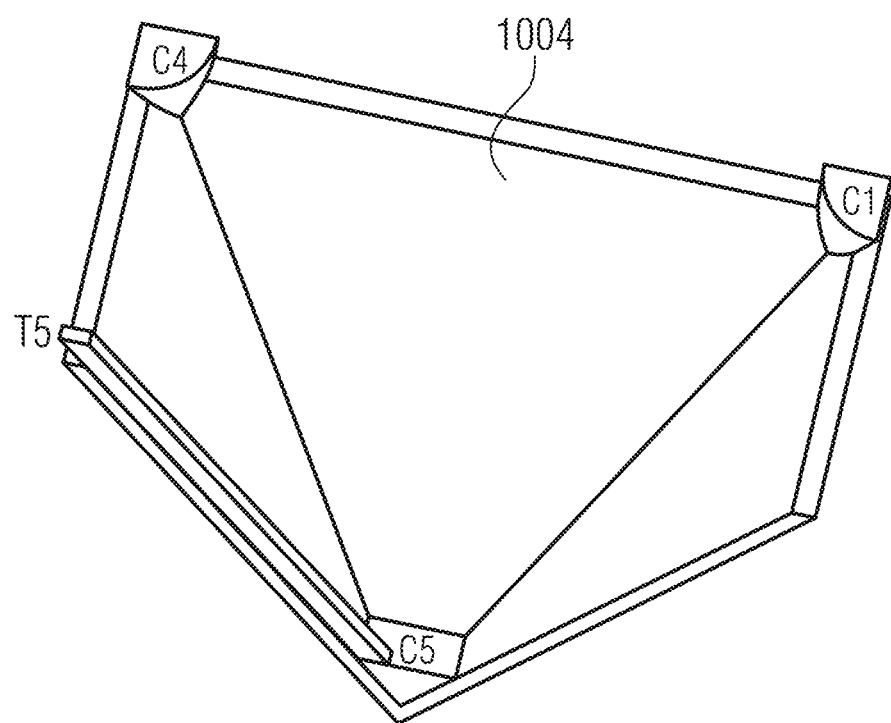

FIG. 10B
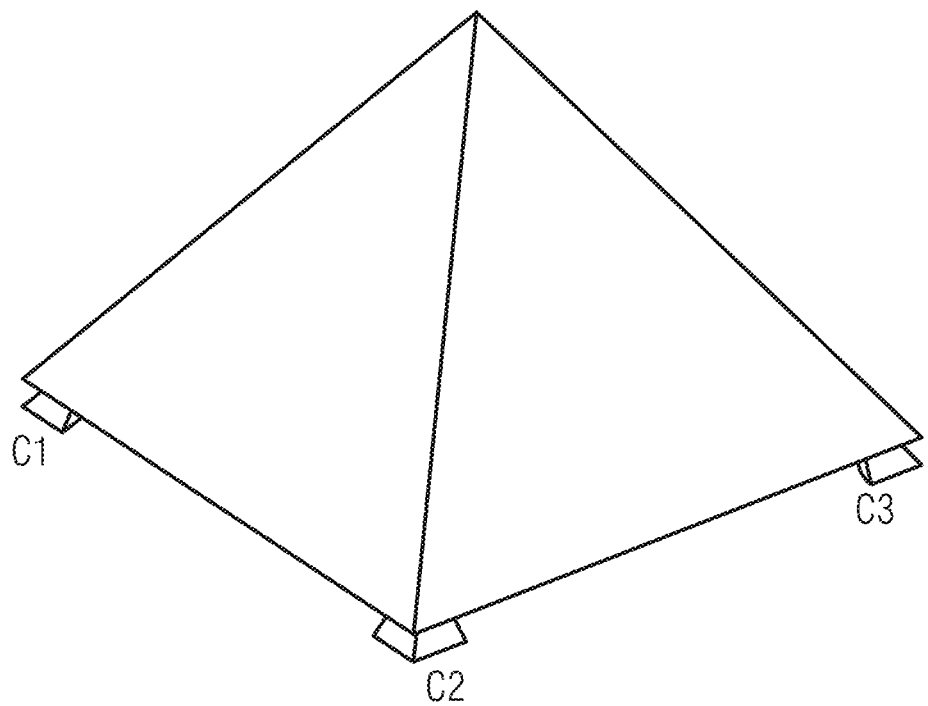
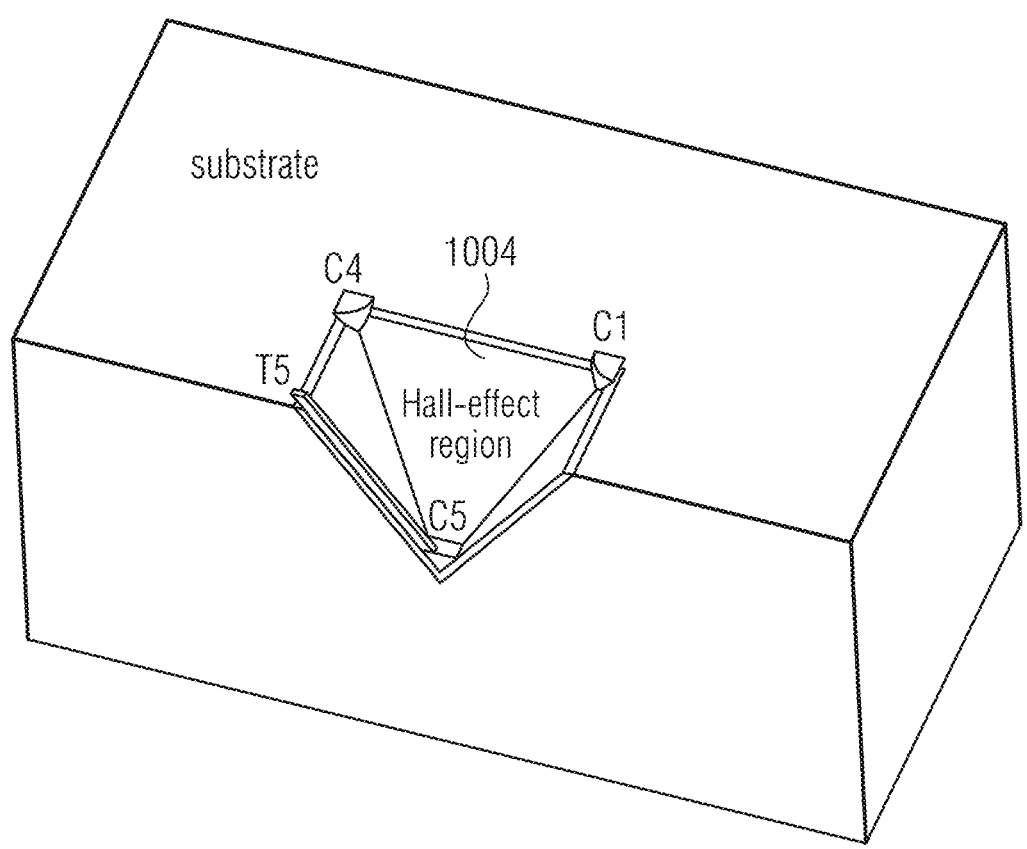

FIG. 10C
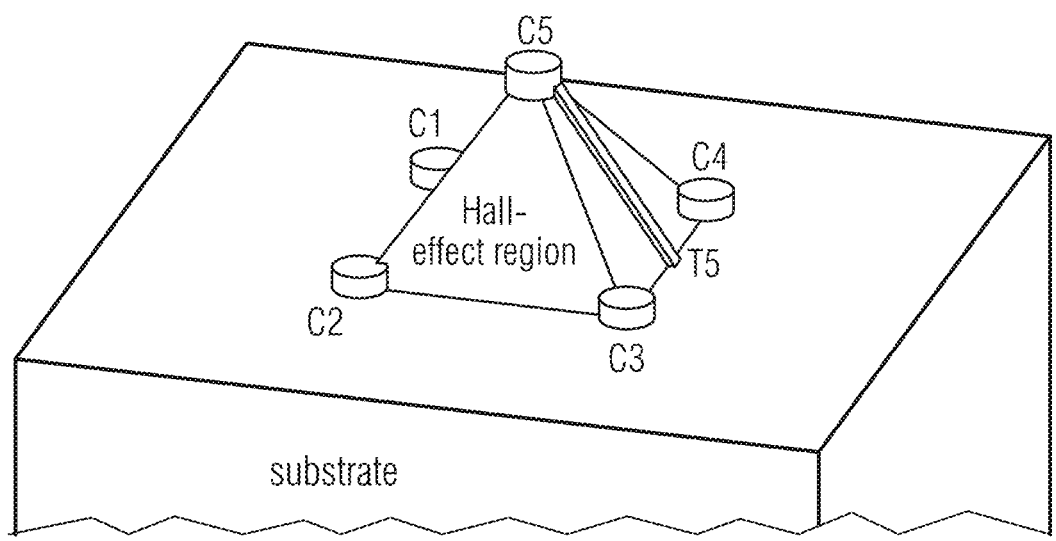
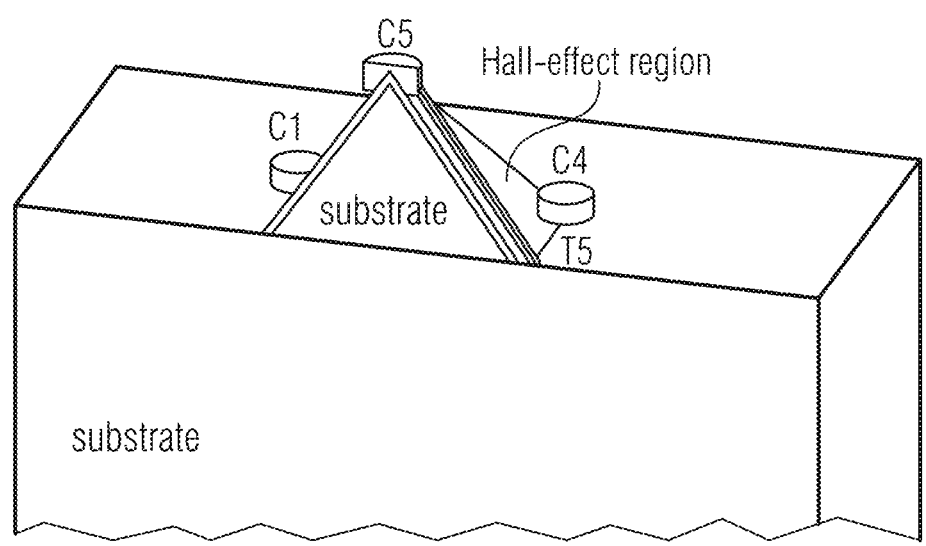

FIG. 10D
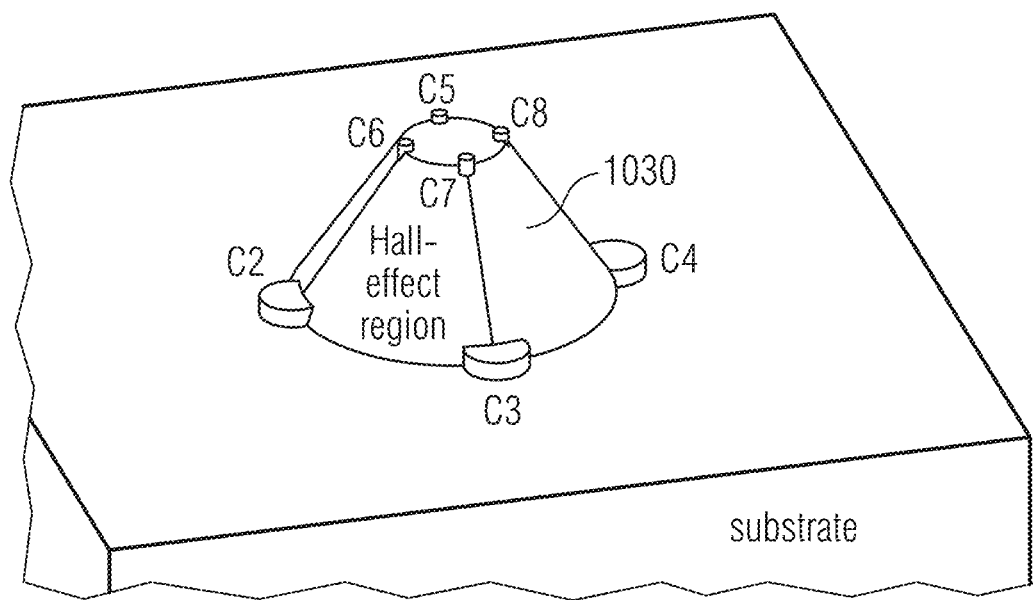
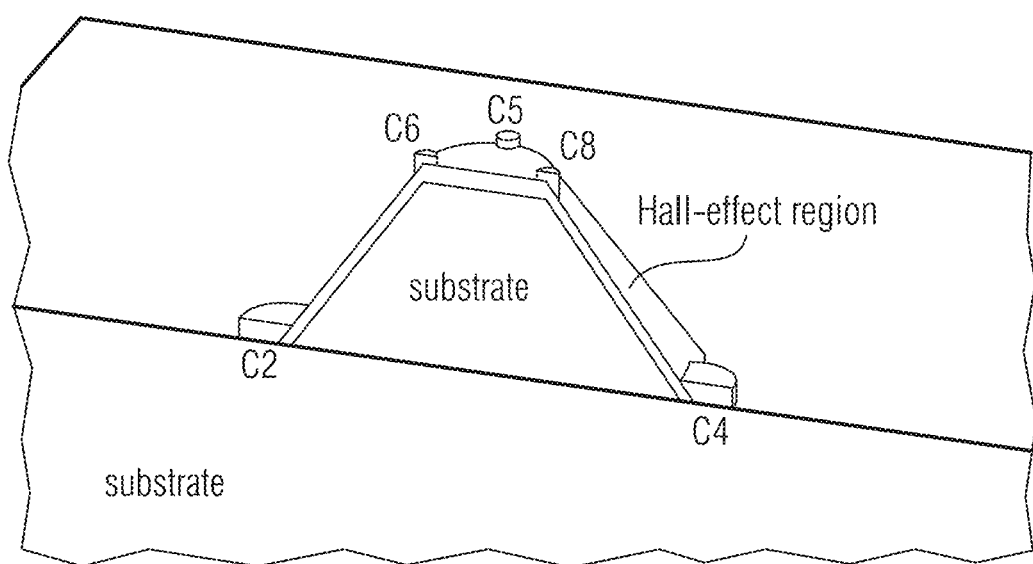

HALL SENSOR DEVICE AND HALL SENSING METHOD

RELATED APPLICATION

This application is a divisional of U.S. patent application Ser. No. 15/596,017, filed May 16, 2017, which claims priority under 35 U.S.C. § 119 to German Patent Application No. 102016109883.3, filed on May 30, 2016, the contents of which are incorporated by reference herein in their entirety.

TECHNICAL FIELD

The present disclosure generally relates to magnetic field sensor devices, and, more particularly, to Hall sensor devices.

BACKGROUND

Hall effect devices are semiconductor devices used to measure magnetic field. They produce an output signal proportional to magnetic field. At zero magnetic field, they tend to output a signal, which is usually different from zero: this is their offset error(=zero field error).

Hall effect devices comprise a Hall effect region where the Hall effect takes place and with three or more contacts in or in ohmic contact with the Hall effect region. An electrical contact to the Hall effect region can be made by a contact diffusion or implantation process, for example. Sometimes several contacts can be connected via metal lines (in the interconnect layer of the semiconductor technology) to the same terminal. Terminals can be used to supply the device with electric power and to tap its output signals.

If the Hall effect region is a two-dimensional electron gas (2 DEG), it can be regarded as a sheet layer with vanishing thickness (in practice the thickness can be in the order of 10 nm) and contacts can be made differently than with tubs (because of the thin device). Note that 2 DEG is an electron gas that is free to move in two dimensions, but tightly confined in the third.

Hall plates, which we also call Horizontal Hall effect devices or HHalls, are flat devices with thicknesses 5 . . . infinitely (typically 50) times smaller than their lateral size. They are used to detect magnetic field components along their thickness direction (i.e. direction into the semiconductor substrate). In silicon technology Hall plates are currently typically 1 . . . 3 µm thick and 10 . . . 100 µm large in lateral directions. Their layout can be rectangular, square, circular, octagonal, cross-shaped, or even triangular.

Vertical Hall effect devices or VHalls are stout devices where one lateral dimension is comparable (0.2 times up to 10 times) to their thickness direction (i.e. direction into the semiconductor substrate). They often have the shape of long stripes, mostly straight, sometimes curved, arc-shaped, or even circular rings. They can be used to detect magnetic field components parallel to the semiconductor main surface.

The terms "horizontal" and "vertical" denote the orientation of the plate-like geometry of the devices with respect to the main surface of the semiconductor die.

As mentioned before, Hall effect devices can suffer from offset error. Offset error is the presence of an output signal in the absence of some input quantity. For Hall sensors, the offset error would be an output signal indicative of an input magnetic field when in fact no magnetic field is present.

Offset error can relate to different causes, two of which are raw offset error and residual offset error. Raw offset error can refer to an offset error present in a particular operating phase. Residual offset error can refer to an offset error present in an overall or total output signal, such as a signal which is a combination of those from individual operating phases.

One approach for reducing or eliminating offset error is using a multi-contact Hall sensor. Three-contact or four-contact HHalls or VHalls can be operated in a spinning current-type mode, which changes the supply or sense role of the contacts in multiple clock phases such that any offset is reduced when the signals from the multiple clock phases are combined. Even so, the residual offset error can remain higher than desired, such as in the range of about 1 milli-Tesla (mT).

Both conventional HHalls and VHalls are limited with respect to detecting magnetic field components in the 3-dimensional (3D) space. It is therefore desirable to have Hall sensor devices with large magnetic sensitivity to specific magnetic field components in 3D-space. It is further desirable to combine signals tapped in different operating modes in a favorable way to cancel out offset errors and still preserve a large 3D magnetic sensitivity.

SUMMARY

According to a first aspect, the present disclosure provides a Hall sensor device which comprises a 3-dimensional Hall sensor element having a Hall effect region implemented in a 3-dimensional shell and comprising at least three terminals. The 3-dimensional shell can be thought of a three-dimensional solid whose thickness is very small when compared with other dimensions. Each terminal is connected to at least one electrical contact of the Hall effect region. Each electrical contact is disposed at a different region of the 3-dimensional shell.

In some embodiments, the thickness of the 3-dimensional shell can be less than 10%, less than 5% or even less than 1% of an extension in any other dimension.

In some embodiments, the 3-dimensional shell comprises semiconductor material. The Hall effect region can be implemented in the 3-dimensional shell via doped regions of semiconductor material, for example. In case of 2 DEG, the Hall effect region can be implemented in transistor-like structures made from semiconductors. Thus, in some embodiments, the 3-dimensional shell can comprise 2 DEG.

In some embodiments, the 3-dimensional shell is a symmetric body. For example, the 3-dimensional shell can have reflectional symmetry, rotational symmetry, translational symmetry, helical symmetry, scale symmetry, or combinations thereof.

In some embodiments, the at least three electrical contacts are not arranged within a common plane on the 3-dimensional shell.

In some embodiments, the at least three electrical contacts are arranged symmetrically on the 3-dimensional shell with respect to one or more symmetry axis.

In some embodiments, the 3-dimensional shell can encompass volume or body of different electrical characteristic than the 3-dimensional shell. For example, an interior of the 3-dimensional shell can be hollow (cavity).

In some embodiments, the 3-dimensional shell is an annular ring shell.

In some embodiments, the 3-dimensional shell is a polyhedral shell encompassing a polyhedral volume. A polyhedron can be understood as a solid in three dimensions with flat polygonal faces, straight edges and sharp corners or vertices. Thus, the polyhedral shell can be understood as a "skin" of a polyhedron. Thus, at least one portion of the 3-dimensional shell is a plain surface. In some embodiments, the 3-dimensional shell consists of an integer number of plain surfaces.

In some embodiments, the polyhedral shell is a shell of one of the following group: a pyramid, a truncated pyramid, an inverted truncated pyramid or an inverted pyramid.

In some embodiments, a pair of adjacent faces (side walls) of the polyhedral shell is in ohmic contact along a common edge joining the pair of adjacent faces.

In some embodiments, each of the at least three contacts is disposed at a different vertex of the polyhedral shell.

In some embodiments, each face of the polyhedral shell with the associated electrical contacts is configured as a respective planar Hall sensor element.

In some embodiments, each face of the polyhedral shell comprises at least three contacts disposed at a different vertex of the respective face.

In some embodiments, the Hall sensor device can further optionally comprise a sensor circuit which is coupled to the at least three terminals and which is configured to operate the Hall sensor element in at least two operating phases. The sensor circuitry is configured to generate a first electrical output quantity using a first pair of the at least three terminals as supply terminals in a first operating phase and to generate a second electrical output quantity using a second pair of the at least three terminals as supply terminals in a second operating phase. The Hall sensor device can also comprise a combination circuit which is configured to combine the first and the second electrical output quantity for offset cancellation or reduction. The skilled person having benefit from the present disclosure will appreciate that an electrical output quantity can be an electrical current or an electrical voltage.

In some embodiments, the combination circuitry is configured to generate an offset corrected output signal based on a sum or difference of the first and the second electrical output quantity.

In some embodiments, the sensor circuitry is configured to, in the first operating phase, apply an electrical supply quantity via a first pair of the three terminals, to ground the remaining of the three terminals, and to measure a first electrical output quantity at the first pair of the three terminals. In the second operating phase, the sensor circuitry is configured to apply the electrical supply quantity via a second pair of the three terminals, to ground the remaining of the three terminals, and to measure a second electrical output quantity at the second pair of the three terminals. In a third operating phase, the sensor circuitry is configured to apply an electrical supply quantity via a third pair of the three terminals, to ground the remaining of the three terminals, to measure a third electrical output quantity at the third pair of the three terminals. The combination circuit is configured to combine the first, the second and the third electrical output quantity. The skilled person having benefit from the present disclosure will appreciate that the electrical supply quantity can be an electrical current or an electrical voltage. Likewise, the skilled person having benefit from the present disclosure will appreciate that the electrical output quantity can be an electrical current or an electrical voltage. The plurality of operating phases, which can also include more than three operating phases, thus leads to a spinning current or spinning voltage scheme for dynamic offset cancellation with respect to the 3-dimensional Hall sensor element.

In some embodiments related to spinning current schemes, the sensor circuitry can be configured to, in the first operating phase, inject a supply current via a first of the three terminals, to inject the supply current via a second of the three terminals, to ground a third of the three terminals, and to measure a first output voltage between the first and the second terminal in response to the respective injected supply currents. In the second operating phase, the sensor circuitry can be configured to inject the supply current via the second of the three terminals, to inject the supply current via the third of the three terminals, to ground the first of the three terminals, and to measure a second output voltage between the second and the third terminal in response to the respective injected supply currents. In the third operating phase, the sensor circuitry can be configured to inject the supply current via the third of the three terminals, to inject the supply current via the first of the three terminals, to ground the second of the three terminals, to measure a third output voltage between the third and the first terminal in response to the respective injected supply currents. The combination circuit can be configured to combine the first, the second and the third output voltage for dynamic offset cancellation.

In some embodiments related to spinning voltage schemes, the sensor circuitry can be configured, in the first operating phase, to apply a supply voltage via a first of the three terminals, to apply the supply voltage via a second of the three terminals, to ground a third of the three terminals, to measure at least one first quantity dependent on a first current at the first terminal and a second current at the second terminal (e.g., a current difference between the first and second terminal). In the second operating phase, the sensor circuitry can be configured to apply the supply voltage via the second of the three terminals, to apply the supply voltage via the third of the three terminals, to ground the first of the three terminals, to measure at least one second quantity dependent on a third current at the second terminal and a fourth current at the third terminal (e.g., a current difference between the second and third terminal). In the third operating phase, the sensor circuitry can be configured to apply the supply voltage via the third of the three terminals, to apply the supply voltage via the first of the three terminals, to ground the second of the three terminals, to measure at least one third quantity dependent on a fifth current at the third terminal and a sixth current at the first terminal (e.g., a current difference between the third and first terminal). The combination circuit can be configured to combine the at least three measured quantities, e.g., the six currents or the three current differences for dynamic offset cancellation.

In some embodiments, the Hall sensor device comprises at least four terminals and the sensor circuitry is configured to, in the first operating phase, apply a first electrical supply quantity using a first pair of the four terminals as input terminals, and to measure the first electrical output quantity between a second pair of the four terminals as output terminals in response to the first electrical supply quantity. In the second operating phase, the sensor circuitry can be configured to apply a second electrical supply quantity using the second pair of the four terminals as input terminals, and to measure the second electrical output quantity between the first pair of the four terminals as output terminals in response to the second electrical supply quantity.

In some embodiments, the Hall sensor element comprises at least eight contacts, each disposed at a different point or region of the 3-dimensional shell. Each of the at least four terminals can be connected to a different one of the at least eight contacts or each of the at least four terminals can be connected to a different pair of the at least eight contacts. In some embodiments, each pair of contacts comprises contacts associated with opposite faces (side walls) of the 3-dimensional shell. In some embodiments, the Hall sensor device can further optionally comprise a plurality of switches, wherein each switch is configured to selectively short a pair of contacts.

In some embodiments related to Hall sensor devices with at least four terminals, the sensor circuitry is configured to inject an electric current into one of the input terminals and to measure a voltage between the output terminals, or to apply an electric voltage between the input terminals and to measure a short circuit current between the output terminals.

In some embodiments, the sensor circuitry is configured to ground one input terminal while the electric current is injected to the other one of the input terminals.

In some embodiments related to Hall sensor devices with at least four terminals, the sensor circuitry is configured to, in a third operating phase, apply a third electrical supply quantity of reversed polarity of the first electrical supply quantity using the first pair of the four terminals as input terminals, to measure a third electrical output quantity between the second pair of the four terminals as output terminals in response to the third electrical supply quantity. In a fourth operating phase, the sensor circuitry can be configured to generate a fourth electrical supply quantity of reversed polarity of the second electrical supply quantity using the second pair of the four terminals as input terminals, to measure a fourth electrical output quantity between the first pair of the four terminals as output terminals in response to the fourth electrical supply quantity. The combination circuitry can be configured to generate the combined output signal based on a combination of the first, the second, the third, and the fourth electrical output quantity.

In some embodiments, the combination circuitry is configured to generate an offset corrected output signal based on a difference between a first sum of the first and second electrical output quantity and a second sum of the third and fourth electrical output quantity.

In some embodiments related to the Hall effect region being implemented in polyhedral shells, the sensor circuitry is configured to, in the first operating phase, apply the first electrical supply quantity using a first and a second of four contacts disposed at different vertices of a first face of the 3-dimensional shell surface, and to measure the first electrical output quantity between a third and a fourth of the four contacts of the first face in response to the first electrical supply quantity. In the second operating phase, the sensor circuitry can be configured to apply a second electrical supply quantity using the third and the fourth of the four contacts of the first face, and to measure a second electrical output quantity between the first and the second of the four contacts of the first face in response to the second input signal. In a third operating phase, the sensor circuitry can be configured to apply a third electrical supply quantity of reversed polarity of the first electrical supply quantity using the first and the second of the four contacts of the first face, to measure a third electrical output quantity between the third and the fourth of the four contacts of the first face in response to the third electrical supply quantity. In a fourth operating phase, the sensor circuitry can be configured to apply a fourth electrical supply quantity of reversed polarity of the second electrical supply quantity using the third and the fourth of the four contacts of the first face, to measure a fourth electrical output quantity between the first and the second of the four contacts of the first face in response to the fourth electrical supply quantity. In a fifth operating phase, the sensor circuitry can be configured to apply a fifth electrical supply quantity using a first and a second of four contacts disposed at different vertices of a second face of the 3-dimensional shell surface opposite the first face, to measure a fifth electrical output quantity between a third and a fourth of the four terminals of the second face in response to the fifth electrical supply quantity. In a sixth operating phase, the sensor circuitry can be configured to apply a sixth electrical supply quantity using the third and the fourth of the four terminals of the second face, and to measure a sixth electrical output quantity between the first and the second of the four terminals of the second face in response to the sixth electrical supply quantity. In a seventh operating phase, the sensor circuitry can be configured to apply a seventh electrical supply quantity of reversed polarity of the fifth electrical supply quantity using the first and the second of the four terminals of the second face, and to measure a seventh electrical output quantity between the third and the fourth of the four terminals of the second face in response to the seventh electrical supply quantity. In an eighth operating phase, the sensor circuitry can be configured to apply an eighth electrical supply quantity of reversed polarity of the sixth electrical supply quantity using the third and the fourth of the four terminals of the second face, and to measure an eighth electrical output quantity between the first and the second of the four terminals of the second face in response to the eighth electrical supply quantity. The combination circuitry can be configured to generate the combined output signal based on a combination of the first, the second, the third, the fourth, the fifth, the sixth, the seventh, and the eighth electrical output quantity.

According to a further aspect, the present disclosure provides a Hall sensor device with a 3-dimensional Hall sensor element comprising a 3-dimensional active Hall effect region in a 3-dimensional polyhedral shell of semiconductor material. The 3-dimensional Hall sensor element further comprises at least three terminals associated with different vertices of the 3-dimensional polyhedral semiconductor shell. Each terminal is connected to at least one electrical contact of the Hall effect region. Each electrical contact is disposed at a different region of the 3-dimensional shell. The Hall sensor device further comprises a sensor circuit which is coupled to the at least three terminals and is configured to operate the Hall sensor element in at least two operating phases. The sensor circuitry is configured to generate a first electrical output quantity using a first pair of the at least three terminals as supply terminals in a first operating phase and to generate a second electrical output quantity using a second pair of the at least three terminals as supply terminals in a second operating phase. The Hall sensor device also comprises combination circuit which is configured to combine the first and the second electrical output quantity for offset cancellation.

In some embodiments, the polyhedral shell is of one of the following group of a pyramid, a truncated pyramid, an inverted truncated pyramid or an inverted pyramid.

According to a further aspect, the present disclosure provides a Hall sensing method for a Hall effect region integrated in a 3-dimensional shell using at least three terminals. Each terminal is connected to at least one electrical contact of the Hall effect region. Each electrical contact is disposed at a different region of the 3-dimensional shell. The method includes generating a first electrical output quantity using a first pair of the at least three terminals as supply terminals during a first operating phase and generating a second electrical output quantity using a second pair of the at least three terminals as supply terminals during a second operating phase. The method also includes combining the first and the second electrical output quantity for offset cancellation.

BRIEF DESCRIPTION OF THE DRAWINGS

FIG. 2A shows a truncated pyramid-like solid body and a current distribution therein;

FIG. 2B shows a truncated pyramid-like shell and a current distribution therein;

FIG. 3A shows an embodiment of a Hall sensor device comprising a 3-dimensional Hall sensor element with a Hall effect region implemented in a 3-dimensional truncated pyramid-like shell and eight contacts and a voltage distribution therein;

FIG. 3B shows the embodiment of FIG. 3a and a current distribution therein;

FIG. 4A shows electrical potentials at different contacts of the 3-dimensional Hall sensor device for one specific pair of supply contacts;

FIG. 9A-9B illustrate potential distributions and current streamlines for further possible operating phases;

FIGS. 10A-10F show different examples of Hall effect regions implemented in various 3-dimensional shells.

DETAILED DESCRIPTION

Figure 1A:
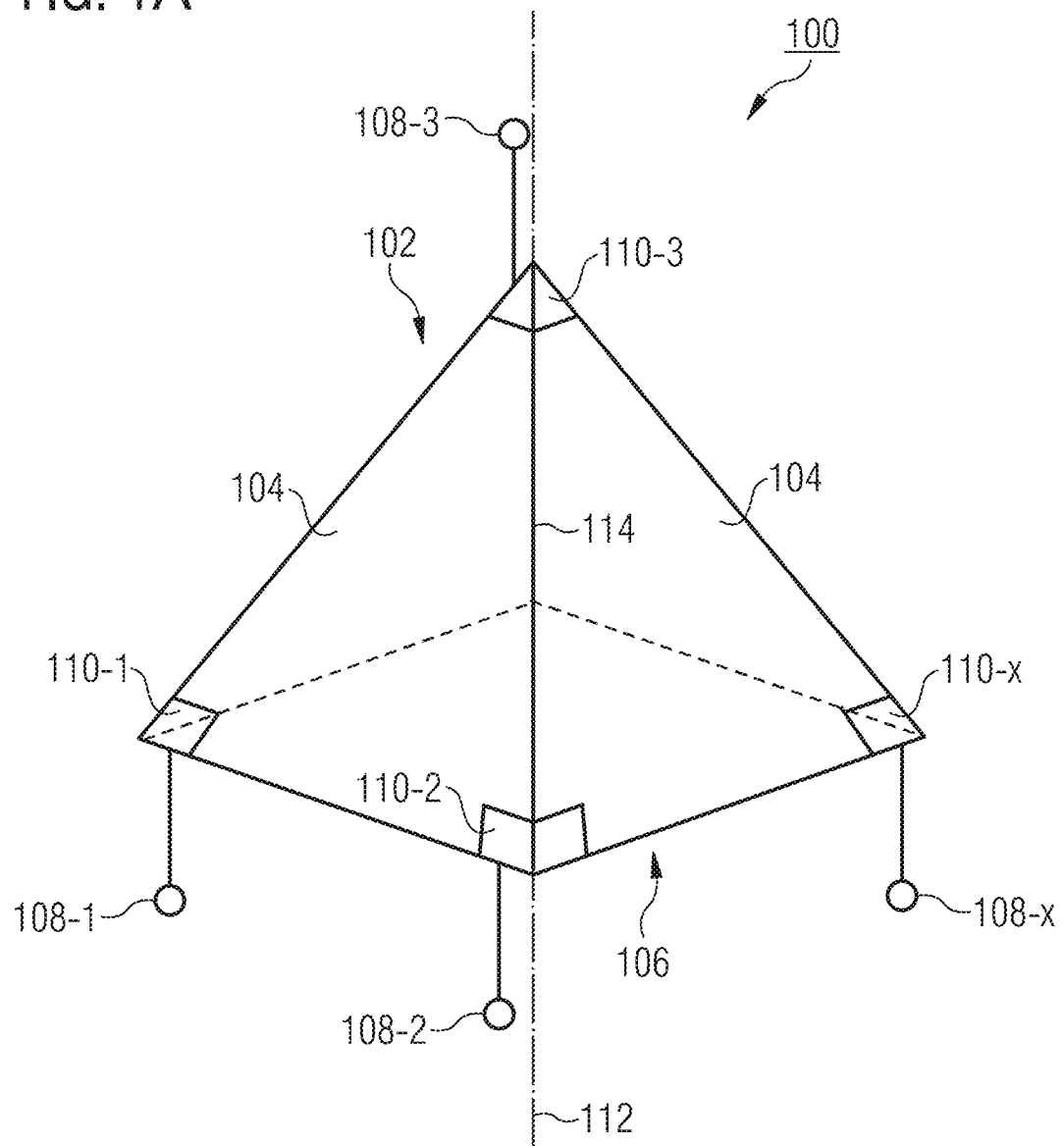
FIG. 1A shows an embodiment of a Hall sensor device comprising a 3-dimensional Hall sensor element with a Hall effect region implemented in a 3-dimensional pyramid-like shell.

Various example embodiments will now be described more fully with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art, unless expressly defined otherwise herein.

Embodiments relate to 3-dimensional multi-contact Hall sensor devices implemented in 3-dimensionally shaped shell structures and operating methods thereof that can reduce or eliminate offset error. In embodiments, 3-dimensional Hall sensor devices can comprise three or more contacts, and multiple such sensor devices can be combined. Operating modes can be implemented for the 3-dimensional multi-contact Hall sensor devices which offer significant modifications of and improvements over conventional spinning current/voltage principles, including reduced residual offset. As previously mentioned, offset error can relate to different causes, two of which are raw offset error and residual offset error. Raw offset error can refer to an offset error present in a particular operating phase, whereas residual offset error can refer to an offset error present in an overall or total output signal, such as a signal which is a combination of those from individual operating phases. Therefore, raw offset errors in multiple operating phases can be combined to create either an increased residual offset error, which is undesired, or to partially or completely cancel raw offset errors such that the residual offset error is reduced or eliminated.

Embodiments relate to 3-dimensional Hall-effect regions which are not plane structures. By a plane structure we mean any substantially 2-dimensional geometry that can be drawn on a piece of flat paper and extruded in a direction vertical to this plane, such as, for example, a rectangular cuboid. Most prior art Hall effect regions are plane structures: the classical Hall plate is a plane structure and also the classical vertical Hall effect device is a plane structure, because both can be obtained by drawing their cross-section and extruding it into a direction orthogonal to the cross-section. One important difference between plane and non-plane Hall-effect regions is, that only for plane Hall-effect regions it is possible to apply a magnetic field in a specific direction—namely perpendicularly to the plane—so that the magnetic field is perpendicular to all current streamlines in the Hall-effect region in at least one operating phase. In the non-plane Hall-effect regions disclosed herein, the angle between the current density and a homogeneous magnetic field in arbitrary direction will not be constant in the entire Hall-effect region.

FIG. 1A illustrates an example of a Hall sensor device 100 according to an embodiment.

Hall sensor device 100 comprises a 3-dimensional Hall sensor element 102 having a 3-dimensional Hall effect region 104 implemented in a 3-dimensional shell structure 106 which is not a plane structure falling under the definition above. Hall sensor device 100 comprises at least three terminals 108. The 3-dimensional shell 106 can be considered as a three-dimensional solid whose thickness is very small when compared with other dimensions. In other words, the 3-dimensional shell structure 106 is merely a thin hull or film and not a complete solid body. However, it may cover such a solid body in some embodiments. This solid body or volume encompassed by the 3-dimensional shell 106 can have a different electrical characteristic than the 3-dimensional shell 106 itself. Thus, the 3-dimensional shell 106 can encompass a region which is either electrically isolating, or which is electrically conducting, but in the latter case it is either electrically isolated against major portions of the 3-dimensional shell surface or no current flows in it.

Each terminal 108 is connected to at least one electrical contact 110 of the 3-dimensional Hall effect region 104. Each electrical contact 110 is disposed at a different region of the 3-dimensional shell structure 106. In the illustrated example, each of the at least three contacts 110 is disposed at a different vertex of the 3-dimensional shell structure 106. Thus, the entirety of the contacts 110 can be arranged in different planes (not coplanar), while a subset of the contacts 110 can be arranged either in a common plane (coplanar) or in different planes. Preferably the at least three electrical contacts 110 are arranged symmetrically on or around the 3-dimensional shell 106 with respect to one or more symmetry axis 112. In this case better offset cancellation results may be achieved as will become apparent in the sequel.

In the illustrated example, shell structure 106 is a pyramid shell. The sidewalls/faces of the pyramid shell 106 can be equilateral triangles or isosceles triangles in some embodiments. However, other 3-dimensional shell structures would be possible as well. Other examples of the 3-dimensional shell structure 106 according to the present disclosure are half-spherical shells or parts of it (spherical shell calottes), cylindrical shells, conical shells, truncated pyramid shells, shells of parallelepipeds and cubic shells—just to name a few examples. Thus, in a more general sense, the 3-dimensional shell 106 can be a curved or polyhedral shell partially or fully coating a corresponding volume, such as, for example, a polyhedral volume or a polyhedron. Thus, at least some sidewalls/faces of the shell structure 106 can be curved or otherwise tilted. The shells may be closed (then they surround in interior volume, these shells are envelopes) or open. In the latter case, a base plate of the pyramid shell 106 of FIG. 1A would be missing. Said differently, the bottom of the pyramid shell 106 would be open.

In some embodiments, the 3-dimensional shell can comprise semiconductor material. For example, Hall-effect devices according to the present disclosure can be manufactured on the surface of a pyramid or truncated pyramid, which can either be grown on top of (100)-silicon(=pyramid) or etched into (100)-silicon (inverted pyramid). In an example, a III-V heterojunction can be grown on top of that silicon pyramid (outer surface) or inverted pyramid (inner surface), which can act as a very thin (2 DEG=two-dimensional electron gas) Hall-effect region 104. Thereby a heterojunction denotes the interface that occurs between two layers or regions of dissimilar crystalline semiconductors.

In some embodiments, the Hall-effect region 104 can cover the entire surface of the 3-dimensional shell structure 106, such as, for example, an inverted pyramid or a pyramid. Therefore we call it a shell. Note that the Hall-effect region 104 covers the (truncated) pyramid of FIG. 1A like a table cloth, but it does not need to cover the base-surface of the pyramid. Similarly, if we have an inverted truncated pyramid, the Hall-effect region 104 can cover the tilted sidewalls and small bottom surface but not the large base-surface. The contacts 110 can be made in some or all corners/vertices of the (inverted) pyramid shell. Since it may not be possible to isolate all faces of the 3-dimensional shell structure 106 from each other, we may have to accept that a current does not flow only on a single face of the 3-dimensional shell structure 106 but also crosses over to other faces. Thus, a pair of adjacent faces of the 3-dimensional shell 106 may be in ohmic contact along a common edge 114 joining the pair of adjacent faces. Therefore, current can flow past a sense-contact 110 on both sides. This can, however, slightly reduce magnetic sensitivity.

The 3-dimensional shell structure 106 of FIG. 1A has a specific aperture angle. In the example of FIG. 1A, the side-walls of the pyramid can be (111)-silicon surfaces, whereas its bottom surface can be a (100)-silicon surface. Thus, the angle between both surface normals can be equal to arcos(1/sqrt(3))=54.74° in this example. The skilled person having benefit from the present disclosure will appreciate that other geometries are also possible.

The following description focuses on operating modes of example 3-dimensional Hall-shell structures with at least three electrical contacts. It shows, at which contacts 110 electrical supply quantities (current or voltage) can be supplied and extracted and at which contacts a Hall- or output signal can be measured and how several Hall signals can be combined to cancel out offset(=spinning current/voltage scheme). It is one aspect of this disclosure to disclose operating modes with large magnetic sensitivity to specific magnetic field components in 3D-space. It is a further aspect of this disclosure to disclose how to combine electrical output quantities of different operating modes in a favorable way to cancel out offset errors and still preserve a large magnetic sensitivity.

It has been found that the magnetic sensitivity of 3-dimensional shells is larger than of 3-dimensional solid bodies. Referring to FIGS. 2A-2B, we compare the magnetic sensitivity to Bx-fields of a truncated solid pyramid (FIG. 2A) and an open shell of a truncated pyramid (FIG. 2B). The latter is said to be open, because the large base-surface is missing. In both examples, the (quadratic) base b has a length of 135.5 µm and the top surface has a length of t=22.4 µm and the structure has a height of h=80 µm. In the case of the shell (FIG. 2B) we simply copied the original pyramid (FIG. 2A), shifted it 2 µm down (in negative z-direction) and subtracted it from the original pyramid. In both cases electrical current was injected in one point/vertex 202 of a side-wall or face while the opposite point/vertex 204 of this same sidewall was grounded and the voltage was tapped at the other two vertices 206, 208 of this side-wall. The upper portions of FIGS. 2A-2B show the geometries of solid and open shell bodies, while the lower portions of FIGS. 2A-2B show the respective current streamline.

We used example parameters for low doped silicon: 188.54 S/m conductivity, 0.1177/T mobility. The supply voltage related magnetic sensitivity in the solid case (FIG. 2A) was 0.75 mV/V/T, whereas it was 3.3 mV/V/T in the shell case (FIG. 2B). The supply current related magnetic sensitivity in the solid case (FIG. 2A) was 14.8 V/A/T, whereas it was 164.6 V/A/T in the shell case (FIG. 2B). So the shell has significantly larger voltage and current related magnetic sensitivity. That is why we prefer it. Further, we have an additional parameter of shell thickness which we can use for optimization. Particularly in the case of 2 DEG, the shell thickness can be made rather small to achieve high current related magnetic sensitivities.

Turning back to FIG. 1A, the skilled person having benefit from the present disclosure will appreciate that the contacts 110 or terminals 108 can be coupled to some electrical control circuitry (not shown), which will also be referred to as sensor circuitry in the following. The sensor circuitry can be configured to operate the Hall sensor element 102 in a plurality of operating phases for offset cancellation. In a first operating phase, the sensor circuitry can be configured to generate a first electrical output quantity (voltage or current) using a first pair of the at least three terminals 108-1 to 108-$x$ as supply terminals. In a second operating phase, the sensor circuitry can be configured to generate a second electrical output quantity using a second pair of the at least three terminals 108-1 to 108-$x$ as supply terminals in a second operating phase. The first and the second electrical output quantity can then be combined to a combined output quantity or signal. The latter can be done by means of a dedicated combination circuit (not shown), for example. Note that there are various possible analog and/or digital implementations for the sensor and/or combination circuitry, which will not be discussed herein for the sake of brevity.

Considering the symmetric pyramid shell 106 of FIG. 1A, three operating phases can be used per side wall or face of the pyramid shell, for example. It will be appreciated that each face of the pyramid shell 106 with the respective associated electrical contacts is configured as a respective planar Hall sensor element. Thus, in the example of FIG. 1A, we have at least three tilted planar Hall sensor elements (corresponding to the at least three tilted sidewalls) in ohmic contact to each other. In a first operating phase, an electrical supply quantity can be applied via a first pair (e.g., 108-1 and 108-2) of the three terminals, while the remaining one of the three terminals (e.g., 108-3) is grounded. A first electrical output quantity (voltage or current) can be measured at the first pair (e.g., 108-1 and 108-2) of the three terminals. In a second operating phase, the electrical supply quantity can be applied via a second pair (e.g., 108-2 and 108-3) of the three terminals, while the remaining one of the three terminals (e.g., 108-1) is grounded. A second electrical output quantity is measured at the second pair (e.g., 108-2 and 108-3) of the three terminals. In a third operating phase, the electrical supply quantity can be applied via a third pair (e.g., 108-1 and 108-3) of the three terminals, while the remaining one of the three terminals (e.g., 108-2) is grounded. A third electrical output quantity can be measured at the third pair (e.g., 108-1 and 108-3) of the three terminals. Then, the first, the second and the third electrical output quantity can be combined for offset cancellation or reduction.

An example of a spinning current scheme for the Hall sensor device 100 could look like this:

1$^{st}$ Operating Phase:
inject a supply current via a first of the three terminals, e.g. 108-1,
inject the (same) supply current via a second of the three terminals, e.g. 108-2,
ground a third of the three terminals, e.g. 108-3,
measure a first output voltage V12 between the first and the second terminals, e.g., 108-1 and 108-2, in response to the respective injected supply currents.

2nd Operating Phase:
inject the supply current via the second of the three terminals, e.g. 108-2,
inject the supply current via the third of the three terminals, e.g. 108-3,
ground the first of the three terminals, e.g. 108-1,
measure a second output voltage V23 between the second and the third terminal in response to the respective injected supply currents.

3$^{rd}$ Operating Phase:
inject the supply current via the third of the three terminals, e.g. 108-3,
inject the supply current via the first of the three terminals, e.g. 108-1,
ground the second of the three terminals, e.g. 108-2,
measure a third output voltage V31 between the third and the first terminal in response to the respective injected supply currents.

Then, the first, the second and the third output voltage can be combined, for example by addition with correct sign.

An example of an alternative spinning voltage scheme for the Hall sensor device 100 could look like this:

1$^{st}$ Operating Phase:
apply a supply voltage via a first of the three terminals, e.g. 108-1,
apply the (same) supply voltage via a second of the three terminals, e.g. 108-2,
ground a third of the three terminals, e.g. 108-3,
measure a first current at the first terminal, e.g. 108-1,
measure a second current at the second terminal, e.g. 108-2.

2$^{nd}$ Operating Phase:
apply the supply voltage via the second of the three terminals, e.g. 108-2,
apply the supply voltage via the third of the three terminals, e.g. 108-3,
ground the first of the three terminals, e.g. 108-1,
measure a third current at the second terminal,
measure a fourth current at the third terminal.

3$^{rd}$ Operating Phase:
apply the supply voltage via the third of the three terminals, e.g. 108-3,
apply the supply voltage via the first of the three terminals, e.g. 108-1,
ground the second of the three terminals, e.g. 108-2,
measure a fifth current at the third terminal,
measure a sixth current at the first terminal.

Then, the six currents (or the three resulting current differences) can be combined for offset reduction/cancellation. Instead of separately measuring currents at two terminals in each operating phase the circuits may also short both terminals with an ampere-meter circuit and measure the difference of currents in both terminals and finally combine the three current differences of the three operating phases. Similar to the spinning current scheme, the three operating phases per face or side wall of the 3-dimensional shell 106 can be further combined with operating phases of at least one further face/side wall of the 3-dimensional shell 106.

The three operating phases per face or sidewall of the 3-dimensional shell 106 can be further combined with operating phases related to at least one further face/sidewall of the 3-dimensional shell 106.

Figure 1B:
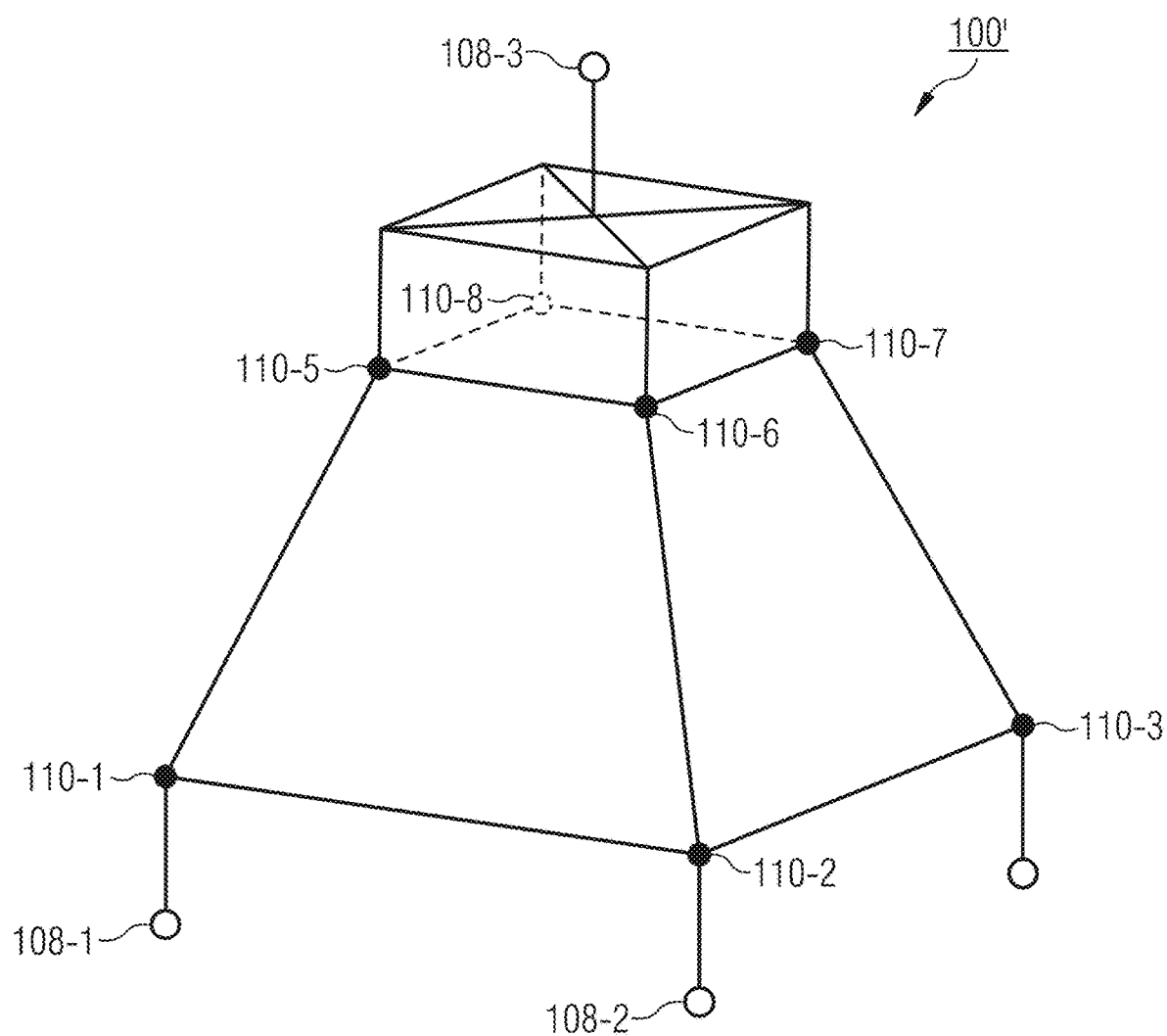
FIG. 1B shows a further embodiment of a Hall sensor device comprising a 3-dimensional Hall sensor element with a Hall effect region implemented in a 3-dimensional truncated pyramid-like shell.

Note that the above principle can also be applied to 3-dimensional shell structures 106 in the shape of an open truncated pyramid shell, see FIG. 1B. The truncated pyramid shell 106 of FIG. 1B comprises eight contact regions 110-1 to 110-8. While four contacts 110-1 to 110-4 are disposed around the base of the truncated pyramid shell 106, the other four contacts 110-5 to 110-8 are disposed around the upper horizontal face of truncated pyramid shell 106. The latter contacts are shorted and connected to a common terminal 108-3, while each of the lower contacts 110-1 to 110-4 can be associated with a respective own terminal 108-1 to 108-4. In this way we obtain a setup comparable to FIG. 1A.

FIG. 3A illustrates a further example of a Hall sensor device 300 according to an embodiment.

Hall sensor device 300 comprises a 3-dimensional Hall sensor element 302 having a 3-dimensional Hall effect region 304 implemented in a 3-dimensional shell structure 306 in the shape of an open truncated pyramid shell. Hall sensor device 300 comprises eight electrical contacts 310-1 to 310-8, each disposed at a different vertex of the truncated pyramid shell 306. Contacts 310-1 to 310-4 (C1-C4) are associated with vertices of the base of the truncated pyramid shell 306, while contacts 310-5 to 310-6 (C5-C8) are associated with vertices of the upper face (apex) of the truncated pyramid shell 306. Note that base and top are of quadratic shape in the illustrated example. This symmetry can be beneficial for offset reduction.

The 3-dimensional Hall sensor device 300 can now be adapted for a spinning scheme or dynamic offset cancellation. Sensor circuitry coupled to the contacts 310 can be configured to operate the Hall sensor device 300 in multiple operating phases. In a first operating phase, a first electrical supply quantity (current or voltage) can be applied via a first pair of four contacts 310 of a face of the truncated pyramid shell 306. A first electrical output quantity (voltage or current) can be measured between a second pair of the four contacts defining the face in response to the first electrical supply quantity. In a second operating phase, a second electrical supply quantity can be applied using the second pair of the four contacts. A second electrical output quantity can be measured between the first pair of the four terminals in response to the second electrical supply quantity. In both operating phases the respective electrical supply quantities may be identical.

According to an illustrative example, contacts C3 and C6 could be used as the first pair of the four contacts, while contacts C2 and C7 could be used as the second pair of the four contacts, which can lead to the following spinning current scheme:

First Operating Phase:
use C3 and C6 as input and output contacts, e.g. inject a constant current of 316 µA into C6, ground C3,
tap output voltage between C2 and C7.

The lower portion of FIG. 3B illustrates a distribution of electric current on the truncated pyramid shell 306 given that a constant current of 316 µA is injected into contact C3 310-3, while contact C6 310-6 is grounded. Likewise, the lower portion of FIG. 3A illustrates a distribution of electric potential on the truncated pyramid shell 306 given that a constant voltage of 1V is applied to contact C3 310-3, while contact C6 310-6 is grounded during a first operating phase. Both contacts C3 and C6 belong to the same face of truncated pyramid shell 306, however to different edges. While contacts C3 and C7 define edge 314-2 joining the tilted face defined by C2, C3, C6, and C7 and the tilted face defined by C3, C4, C7, and C8, contacts C6 and C7 define the horizontal edge 314-5 joining the tilted side face defined by C2, C3, C6 and C7 and the horizontal upper face defined by C5, C6, C7, and C8. At vanishing magnetic flux density (i.e. zero magnetic field) the electric potential at the eight contacts is depicted in FIG. 4A.

Figure 4B:
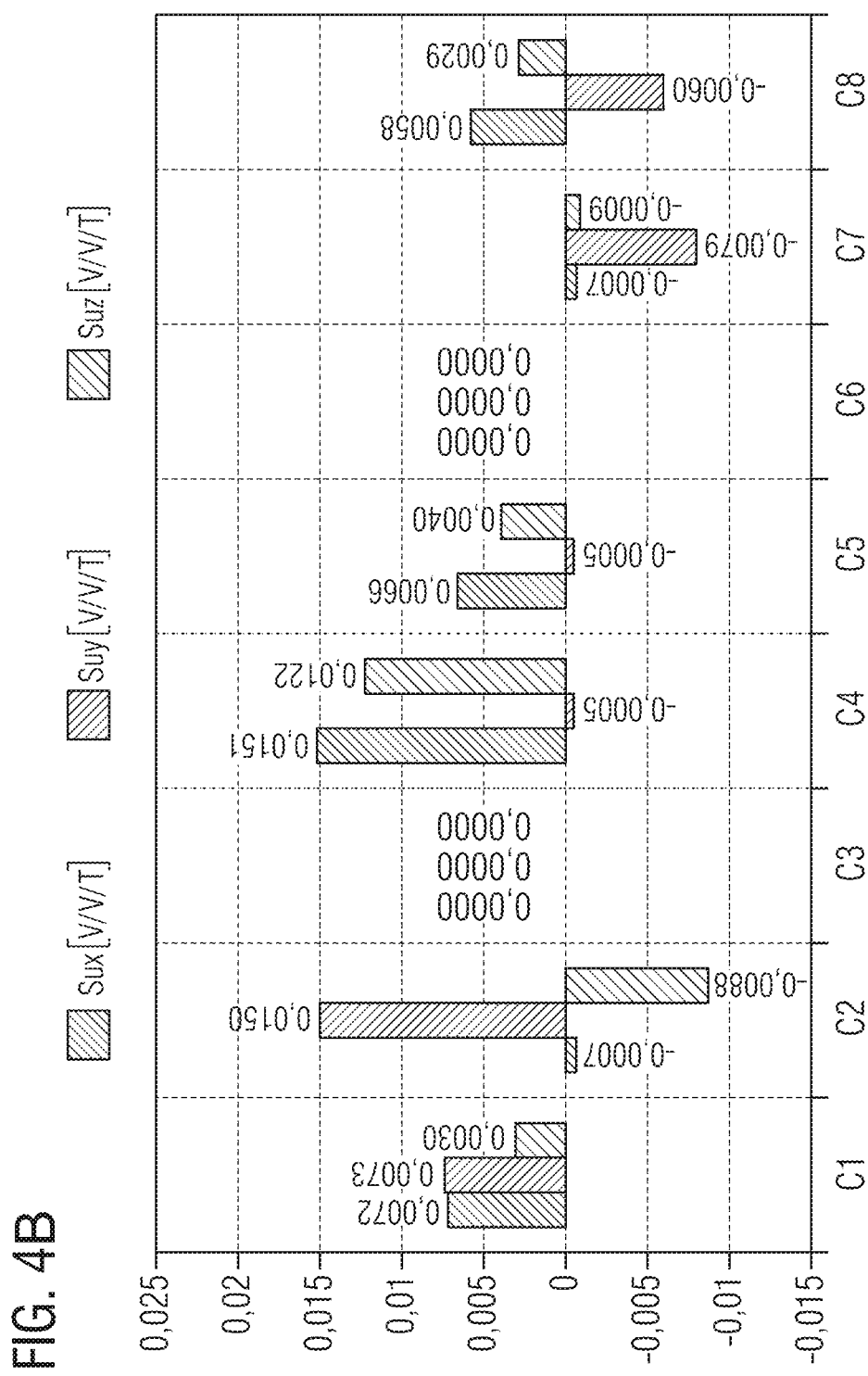
FIG. 4B shows magnetic sensitivities at different contacts of the 3-dimensional Hall sensor device for one specific pair of supply contacts.

Unfortunately there are no two contacts 310 at equal electric potential. Therefore, if we tap the voltages between two contacts, this signal suffers from a large raw offset. For example, the voltage between C2 and C7 is 0.41V−0.26V=0.15V, which is huge: 15% of the supply voltage. However, it is clear that one can re-size the contacts C1 . . . C4 and C5 . . . C8 and the ratio of base-length of the truncated pyramid shell 306 over height of the truncated pyramid shell 306 in order to make this offset small. Because of the large number of parameters involved there should be numerous solutions that satisfy the criterion of vanishing offset voltage. FIG. 4B shows a summary of magnetic sensitivities for all three magnetic field components Bx, By, Bz for this first operating phase. Thereby the supply voltage related magnetic sensitivities are Sux @ Cn=dV(Cn)/dBx/V(C3), Suy @ Cn=dV(Cn)/dBy/V(C3), Suz @ Cn=dV(Cn)/dBz/V(C3), for n=1, 2, 4, 5, 6, 7, 8. One important point is that the voltage at each contact (with exception of the two supply contacts C3 and C6) depends on all three magnetic field components. Therefore, if a circuit combines the potentials of various contacts in various operating phases, it has to minimize overall offset error and it simultaneously has to maximize magnetic sensitivity with respect to a certain magnetic field direction.

Second Operating Phase:
swap input and output contacts, e.g. inject 316 µA into C7, ground C2,
tap output voltage between C3 and C6.

A spinning current scheme according to an example comprises first and second operating phase and combines the output potentials according to $$V\text{total}=V(C2)-V(C7)+V(C3)-V(C6),$$

wherein V(C2) and V(C7) are tapped in the first operating phase and V(C3) and V(C6) are tapped in the second operating phase. Thus, the first and the second electrical output quantity can be combined to an offset corrected output quantity. For this purpose, Hall sensor device 300 can comprise a combination circuit or processor with digital and/or analog circuit components adapted for performing additions and/or subtractions. This scheme can cancel out offset errors and the total voltage Vtotal may only have a very low offset error and still a large magnetic sensitivity to Bx and Bz.

According to the example spinning current scheme explained above, the sensor circuitry can be configured to inject an electric current into one of the input terminals and to measure a voltage between the output terminals. Further, the sensor circuitry can be configured to ground one input terminal while the electric current is injected to the other one of the input terminals.

Reversing the current polarity in the first and second operating phases can yield further optional third and fourth operating phases. Thus, sensor circuitry controlling the contacts 310 can be further configured to, in a third operating phase, apply a third electrical supply quantity (current or voltage) of reversed polarity of the first electrical supply quantity using the first pair C3, C6 of the four terminals as input terminals, to measure a third electrical output quantity (voltage or current) between the second pair C2, C7 of the four terminals as output terminals in response to the third electrical supply quantity. In a fourth operating phase, the sensor circuitry can be configured to generate a fourth electrical supply quantity of reversed polarity of the second electrical supply quantity using the second pair C2, C7 of the four terminals as input terminals, to measure a fourth electrical output quantity between the first pair C3, C6 of the four terminals as output terminals in response to the fourth electrical supply quantity.

If we indicate the potentials tapped in $3^{rd}$ and $4^{th}$ phases by a prime, the total voltage of an improved spinning according to an example current scheme can be expressed as:

$$Vtotal=V(C2)-V(C7)+V(C3)-V(C6)-V(C2')+V(C7')-V(C3')+V(C6').$$

Thus, the combination circuitry of Hall sensor device 300 can be configured to generate the combined output signal Vtotal based on a combination of the first (V(C2)–V(C7)), the second (V(C3)–V(C6)), the third (V(C2')–V(C7')), and the fourth electrical output quantity (V(C3')–V(C6')).

Thus, in a first operating phase, a constant supply current can be injected using a first pair C3, C6 of the four contacts defining a face of the truncated pyramid shell 306. In particular, the current can be injected into C3, while C6 is grounded. A first output voltage V(C2)–V(C7) can be measured between a second pair C2, C7 of the four contacts in response to the supply current. In a second operating phase, the constant supply current can be applied using the second pair C2, C7 of the four contacts. In particular, the supply current can be injected into C7, while C2 is grounded. A second output voltage V(C3)–V(C6) can be measured between the first pair C3, C6 of the four contacts in response to the supply current. In a third operating phase, the constant supply current of reversed polarity is applied using the first pair C3, C6 of the four terminals as input terminals. In particular, the current can be injected into C6, while C3 is grounded. A third output voltage V(C2')–V(C7') can be measured between the second pair C2, C7 of the four terminals. In a fourth operating phase, the constant supply current of reversed polarity is applied using the second pair C2, C7 of the four contacts as input contacts. In particular, the current can be injected into C2, while C7 is grounded. A fourth output voltage V(C3')–V(C6') can be measured between the first pair C3, C6 of the four terminals as output terminals in response to the supply current of reversed polarity.

Another modification of operating modes would be not to inject constant current in all phases of a spinning current scheme but to apply constant voltage to the supply contacts 310 in all phases of a spinning voltage scheme, and not to tap voltage between the output contacts in all phases of a spinning current mode but to measure the short circuit current between the output contacts in all phases of a spinning voltage mode, and to combine the short-circuit currents. Here, an electric voltage is applied between the input terminals and a short circuit current is measured between the output terminals. This can lead to:

$$Itotal=I27+I36-I27'-I36',$$

wherein I27 is the current flowing from contact C2 to contact C7, if they are shorted in the $1^{st}$ phase, I36 is the current flowing from C3 to C6, if they are shorted in the $2^{nd}$ phase, I27' is the current from C2 to C7, if they are shorted in the $3^{rd}$ phase, and C36' is the current from C3 to C6, if they are shorted in the $4^{th}$ phase.

Thus, in a first operating phase, a constant supply voltage (e.g. 1V) can be applied via a first pair C3, C6 of the four contacts defining a face of the truncated pyramid shell 306. In particular, a supply potential of e.g. 1V can be applied to C3, while C6 is grounded. A first short circuit current I27 can be measured between a shorted second pair C2, C7 of the four contacts in response to the supply voltage. In a second operating phase, the constant supply voltage can be applied using the second pair C2, C7 of the four contacts. In particular, the supply potential of e.g. 1V can be applied to C7, while C2 is grounded. A second short circuit current I36 can be measured between the first pair C3, C6 of the four contacts in response to the supply voltage between C2 and C7. In a third operating phase, the constant supply voltage of reversed polarity (e.g. –1V) is applied using the first pair C3, C6 of the four terminals as input terminals. In particular, a supply potential of e.g. 1V can be applied to C6, while C3 is grounded. A third short circuit current I27' can be measured between the shorted second pair C2, C7 of the four terminals. In a fourth operating phase, the constant supply voltage of reversed polarity is applied using the second pair C2, C7 of the four contacts as input contacts. A fourth short circuit current I36' can be measured between the first pair C3, C6 of the four terminals as output terminals in response to the supply voltage of reversed polarity.

In the foregoing we have explained the operating modes and the spinning current scheme applied to the four contacts C2, C3, C6, C7 at the vertices of a single sidewall. The face with vertices at C2, C3, C6, C7 is parallel to the y-axis and therefore the signal of any spinning scheme applied to these contacts depends on Bx and Bz, yet not on By. Spinning schemes can be applied to any face of the shell structure 306 and even in a more general sense we can take any group of four contacts of the entire shell structure 306 and apply this scheme to it. Then the signal is ideally free of offset and sensitive to some magnetic field component Bx, By, Bz or a mixture thereof, depending on the combination of contacts used.

For example, one can combine signals obtained from operating modes at two opposite side-walls of the pyramid shell 306 in order to cancel out Bz-dependence of the output signal. For example, use the left sidewall as a conventional Hall plate in a complete spinning cycle and then use the right sidewall similarly; finally combine all eight signals to get rid of Bz.

In detail:

Phase p1: Inject current I0 into C1, ground C6, sample potential at C2(–) and C5(+)

Phase p2: Inject current I0 into C2, ground C5, sample potential at C1(+) and C6(–)

Phase p3: Inject current I0 into C6, ground C1, sample potential at C2(+) and C5(–)

Phase p4: Inject current I0 into C5, ground C2, sample potential at C1(–) and C6(+)

Phase p5: Inject current I0 into C7, ground C4, sample potential at C3(+) and C8(–)

Phase p6: Inject current I0 into C8, ground C3, sample potential at C4(–) and C7(+)

Phase p7: Inject current I0 into C4, ground C7, sample potential at C3(–) and C8(+)

Phase p8: Inject current I0 into C3, ground C8, sample potential at C4(+) and C7(–)

Add all potentials with (+) and subtract all potentials with (–) to obtain a total signal, which is sensitive to Bx, but not to By and Bz.

More generally for both spinning current and spinning voltage schemes:

$1^{st}$ Operating Phase:
  apply the first electrical supply quantity (current or voltage) using a first and a second of four contacts disposed at different (e.g. diagonally opposite) vertices of a first face of the 3-dimensional shell surface
  measure the first electrical output quantity (voltage or current) between a third and a fourth of the four contacts of the first face in response to the first electrical supply quantity.

$2^{nd}$ Operating Phase:
  apply a second electrical supply quantity using the third and the fourth of the four contacts of the first face, measure a second electrical output quantity between the first and the second of the four contacts of the first face in response to the second input signal.

3$^{rd}$ Operating Phase:
apply a third electrical supply quantity of reversed polarity of the first electrical supply quantity using the first and the second of the four contacts of the first face,
measure a third electrical output quantity between the third and the fourth of the four contacts of the first face in response to the third electrical supply quantity.

4$^{th}$ Operating Phase:
apply a fourth electrical supply quantity of reversed polarity of the second electrical supply quantity using the third and the fourth of the four contacts of the first face, measure a fourth electrical output quantity between the first and the second of the four contacts of the first face in response to the fourth electrical supply quantity.

5$^{th}$ Operating Phase:
apply a fifth electrical supply quantity using a first and a second of four contacts disposed at different vertices of a second face of the 3-dimensional shell surface opposite the first face,
measure a fifth electrical output quantity between a third and a fourth of the four terminals of the second face in response to the fifth electrical supply quantity.

6$^{th}$ Operating Phase:
apply a sixth electrical supply quantity using the third and the fourth of the four terminals of the second face,
measure a sixth electrical output quantity between the first and the second of the four terminals of the second face in response to the sixth electrical supply quantity.

7$^{th}$ Operating Phase:
apply a seventh electrical supply quantity of reversed polarity of the fifth electrical supply quantity using the first and the second of the four terminals of the second face,
measure a seventh electrical output quantity between the third and the fourth of the four terminals of the second face in response to the seventh electrical supply quantity.

8$^{th}$ Operating Phase:
apply an eighth electrical supply quantity of reversed polarity of the sixth electrical supply quantity using the third and the fourth of the four terminals of the second face,
measure an eighth electrical output quantity between the first and the second of the four terminals of the second face in response to the eighth electrical supply quantity.

A combined and offset error corrected output signal may be generated by combining the first, the second, the third, the fourth, the fifth, the sixth, the seventh, and the eighth electrical output quantity. Note that any of the first four operating phases can be carried out simultaneously with any of the operating phases 5, 6, 7, 8. The numbers do not necessarily denote any sequential order in which the operating phases are carried out.

Figure 5:
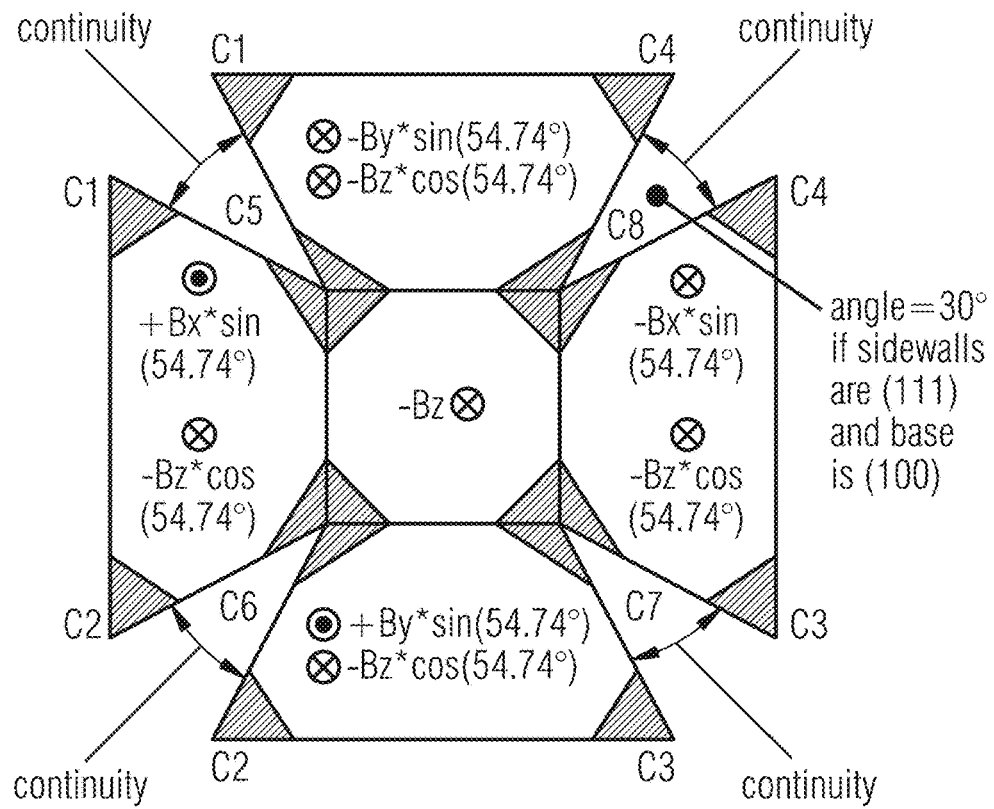
FIG. 5 shows a 2-dimensional representation of the 3-dimensional truncated pyramid-like shell.

Turning now to FIG. 5, we cut the shell 306 open along its tilted edges 314 of the pyramid shell 306 like a card-box to flatten it in a plane, which is easier to draw and to compute. It is possible to work in 2D by unfolding the shell 306 to a plane structure. Then one obtains five plane shapes corresponding to the side faces/walls and the top face of the truncated pyramid shell 306. All four side-walls can be connected to the central top face, yet the connection on the tilted edges 314 of the truncated pyramid shell 306 has to be cut apart: there one has to apply appropriate boundary conditions that make electrical contact like in the original pyramid (the electric potential has to be continuous across the edge from one face to the other). Moreover, x-component Bx of the magnetic field is applied to two opposite faces (in x-direction) with opposite sign, By is also applied to two opposite faces (in y-direction) with opposite sign, and Bz is applied to all faces with the same sign—and in the 2D-model Bx, By, Bz are all perpendicular to the 2D-plane: (all angles are valid for a specific pyramid, where the side-walls are (111)-silicon surfaces and the top plate is a (100)-silicon surface—of course one can change this for different shapes of pyramids with different aperture angles). In FIG. 5, each contact C1 ... C4 is split in two parts C1-C1, C2-C2, C3-C3, C4-C4, which touch, if one folds the cardbox to its 3D-shape of a pyramid again.

Figure 6:
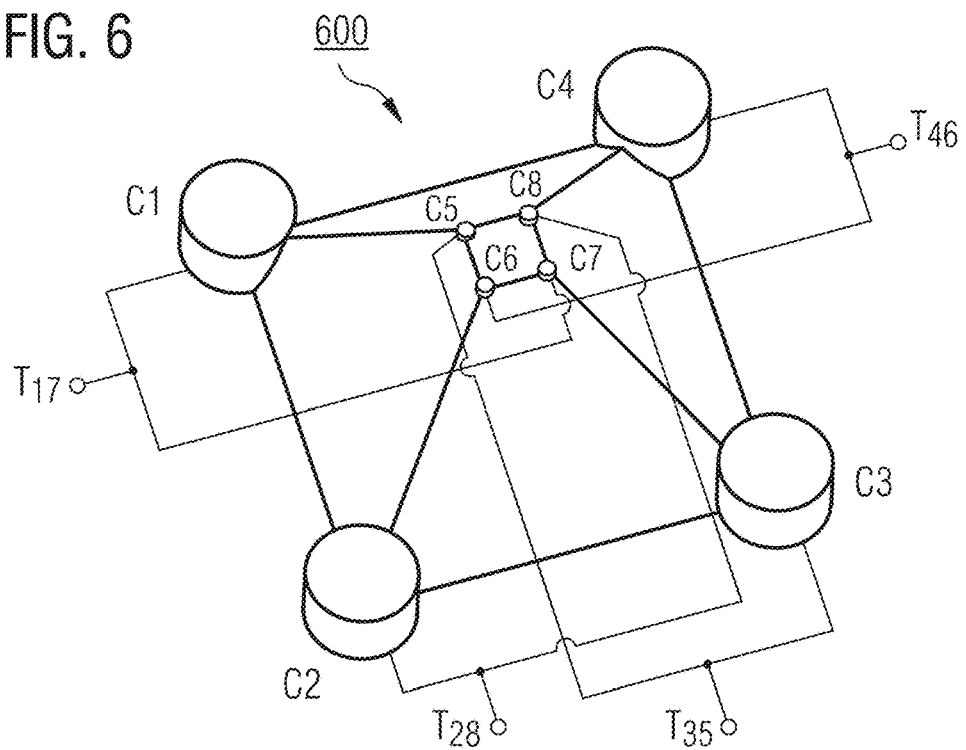
FIG. 6 shows an embodiment of a Hall sensor device with four terminals and eight contacts, wherein each of the four terminals is connected to a different pair of the eight contacts.

In some examples of the present disclosure, we can short two different contacts and connect the shorted contacts to the same terminal. So we can connect the eight contacts 310-1 to 310-8 to only four terminals. In particular, we can short a contact with its counterpart on the opposite sidewall of the polyhedral shell 306. This can simplify operation. There are still several possibilities. One such possibility is the following:

We short contacts C1-C7 to terminal T17, C2-C8 to terminal T28, C3-C5 to terminal T35, C4-C6 to terminal T46. This example is illustrated in FIG. 6.

Now we can operate the device 600 as a device with four terminals using four operating phases.

1$^{st}$ Operating Phase:
apply a first electrical input quantity (current or voltage) using a first and a second of the four terminals as input terminals (for example, T17 and T46);
measure a first electrical output quantity (voltage or current) between a third and a fourth of the four terminals (for example, T28 and T35) as output terminals in response to the first electrical input quantity.

Figure 7A:
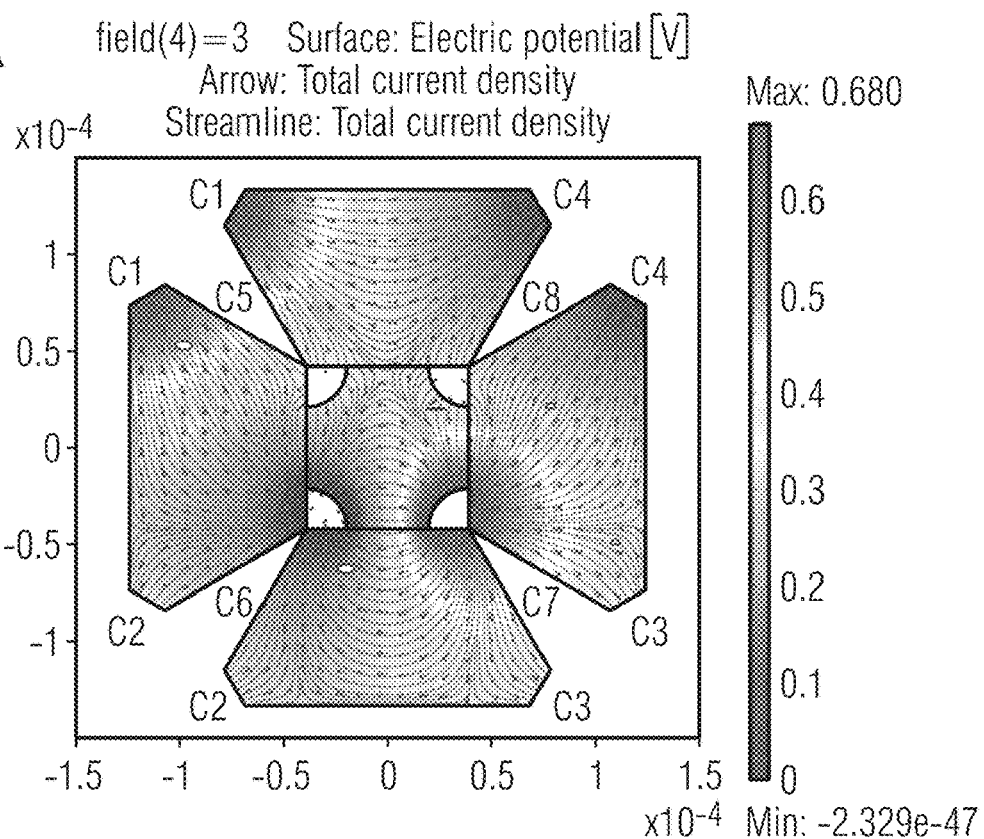
FIGS. 7A-7D illustrate potential distributions and current streamlines for different operating phases.

FIG. 7A shows potential distribution and current streamlines of the first operating phase, wherein a current is injected into terminal T17 (316 µA per contact), while terminal T46 is grounded. In response, a voltage can be measured between terminals T28 and T35. The contacts C1 ... C8 are not drawn in this figure. Instead the boundaries of the contacts represent short circuiting boundaries, which act as contacts.

2$^{nd}$ Operating Phase:
apply a second electrical input quantity using the third and the fourth (for example, T28 and T46) of the four terminals as input terminals,
measure a second electrical output quantity between the first and the second (for example, T17 and T35) of the four terminals as output terminals in response to the second electrical input quantity.

Figure 7B:
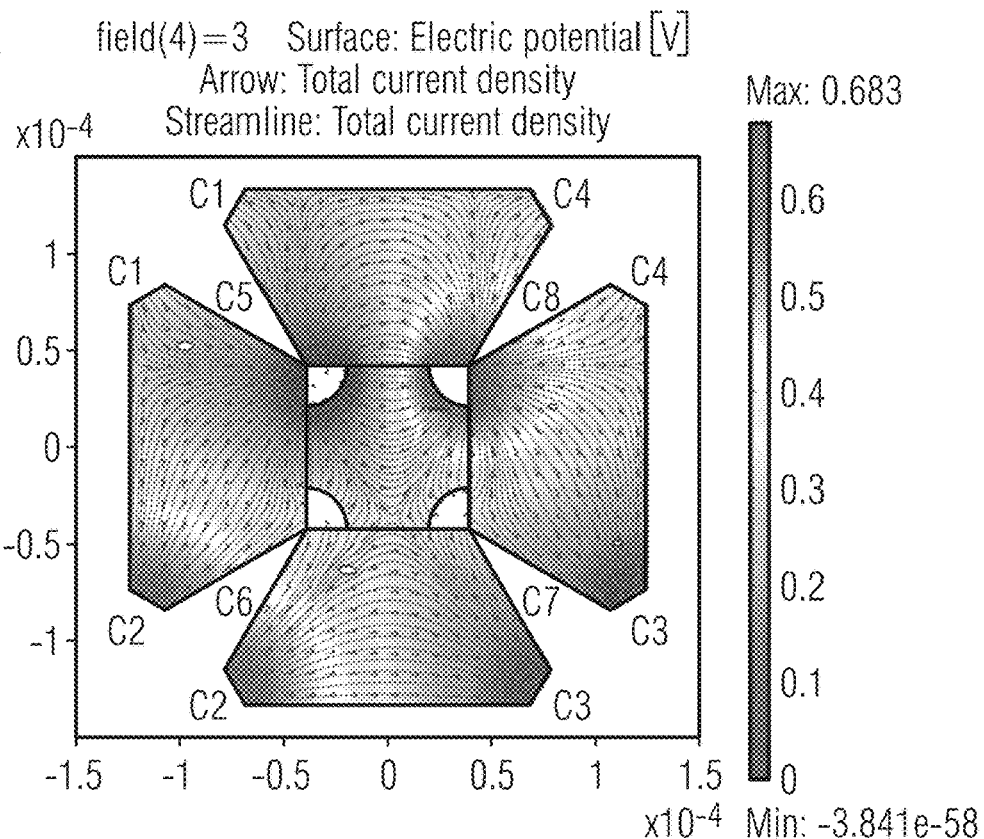

FIG. 7B shows potential distribution and current streamlines of the second operating phase, wherein a current is injected into terminal T28 (316 µA per contact), while terminal T35 is grounded. In response, a voltage can be measured between terminals T17 and T46.

The two phases 1 and 2 can be used as a spinning current scheme, which cancels out offset. Thereby one can tap the voltage at terminals T28 and T35 in phase 1 and T17 and T46 in phase 2. The sensitivity of the total voltage to Bx is rather low (12 mV/V/T) but at least the total voltage does not respond to By or Bz. By-field can also be detected and offset cancelled by spinning. The magnetic sensitivity to By is equal to the magnetic sensitivity to Bx in phases 1, 2: 11.9 mV/V/T.

| Phase no. | C1 | C2 | C3 | C4 | C5 | C6 | C7 | C8 |
|---|---|---|---|---|---|---|---|---|
| 1 | 0.68 V | 0.34 V | 0.34 V | 0 V | 0.34 V | 0 V | 0.68 V | 0.34 V |
| 2 | 0.33 V | 0.68 V | 0 V | 0.34 V | 0 V | 0.34 V | 0.33 V | 0.68 V |

A first type of fields (i.e., fields at phase 1, C1; phase 1, C7; phase 2, C2; and phase 2, C8) denote contacts, where current is injected (316 µA per contact) and a second type of fields (i.e., fields at phase 1, C4; phase 1, C6; phase 2, C3; and phase 2, C5) mean that this contact is grounded.

Further optional operating phases can be used, for example:

3$^{rd}$ Operating Phase:
  apply a third electrical input quantity using the first and the third (for example, T17 and T28) of the four terminals as input terminals,
  measure a third output signal between the second and the fourth (for example, T35 and T46) of the four terminals as output terminals in response to the third input signal.

Figure 7C:
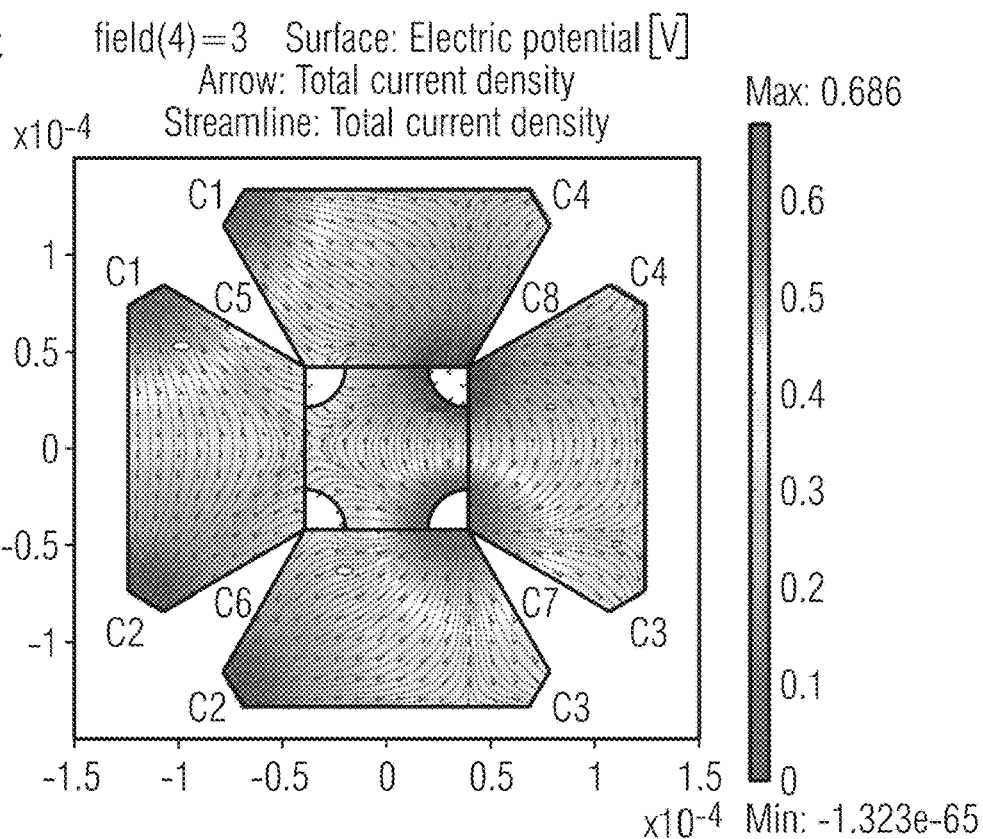

FIG. 7C shows potential distribution and current streamlines of the third operating phase, wherein a current is injected into terminal T17 (316 µA per contact), while terminal T28 is grounded. In response, a voltage can be measured between terminals T35 and T46.

4$^{th}$ Operating Phase:
  apply a fourth input signal using the second and the fourth (for example, T35 and T46) of the four terminals as input terminals,
  measure a fourth output signal between the first and the third (for example, T17 and T28) of the four terminals as output terminals in response to the fourth input signal.

Figure 7D:
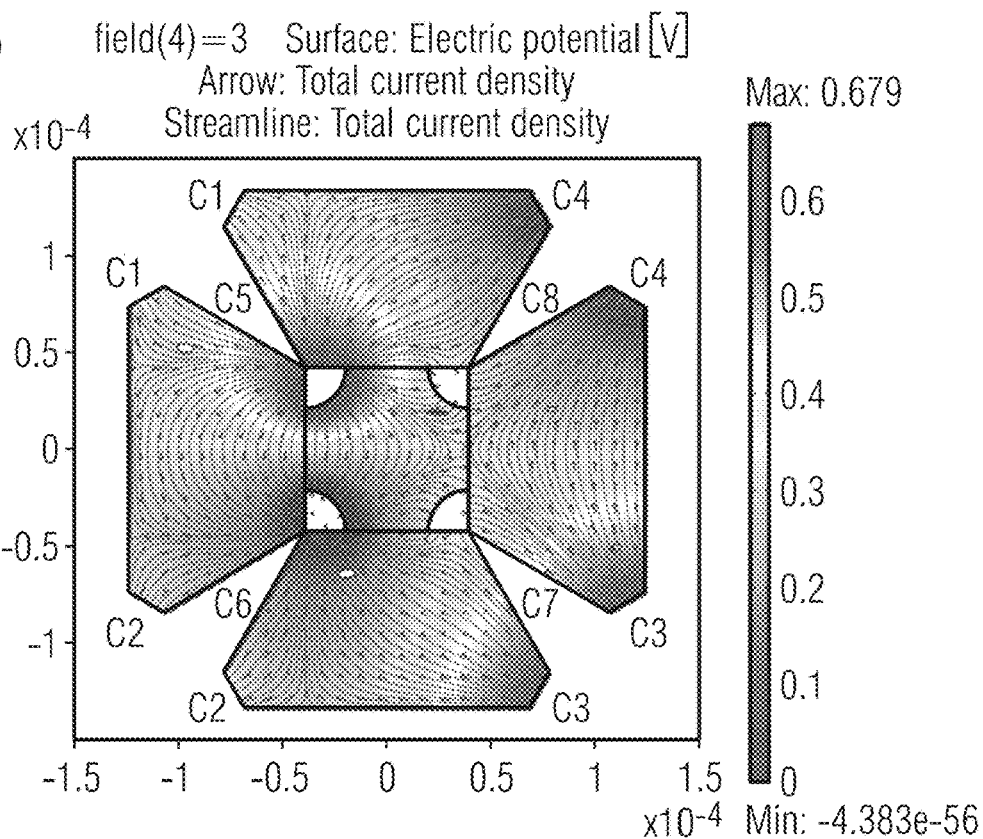

FIG. 7D shows potential distribution and current streamlines of the fourth operating phase, wherein a current is injected into terminal T35 (316 µA per contact), while terminal T46 is grounded. In response, a voltage can be measured between terminals T17 and T28.

| Phase no. | C1 | C2 | C3 | C4 | C5 | C6 | C7 | C8 |
|---|---|---|---|---|---|---|---|---|
| 3 | 0.69 V | 0 V | 0.35 V | 0.34 V | 0.35 V | 0.34 V | 0.69 V | 0 V |
| 4 | 0.34 V | 0.34 V | 0.69 V | 0 V | 0.68 V | 0 V | 0.34 V | 0.34 V |

The first type of fields include fields at phase 3, C1; phase 3, C7; and phase 4, C5 and the second type of fields include fields at phase 3, C2; phase 3, C8; phase 4, C3; phase 4, C4; and phase 4, C6.

In FIGS. 7A-7D, the Hall-region was modeled with a few small holes, which represent flaws in a real device that lead to asymmetries and to stochastic raw offset. FIGS. 7A-7D show potential distribution and current streamlines in phases 1-4.

The spinning current cancellation also works, if we combine the output signals of phases 3 and 4.

Figure 8A:
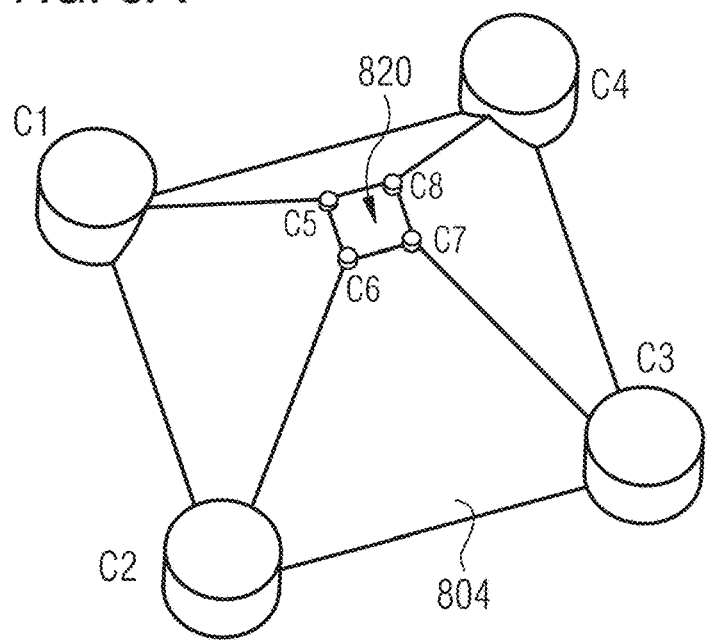
FIG. 8A shows an embodiment of a 3D-annular ring shell.

Can the device of FIG. 6 detect both Bx- and By-fields? It cannot detect Bz-fields. Therefore it would be good if the top surface of the shell 306 has no Hall-effect region, because it only shunts current and does not add signal. This brings us to an embodiment of a 3D-annular ring shell shown in FIG. 8A, which replaces the top surface by a hole 820. In this example, the shell 804 consists only of the four thin-walled side-walls of the pyramid shell (it has not base-plate and not top plate). Note that embodiments also allow for shells with more than one holes. The one or more holes can even be placed asymmetrically instead of being placed centrally symmetric like in FIG. 8A.

Figure 8B:
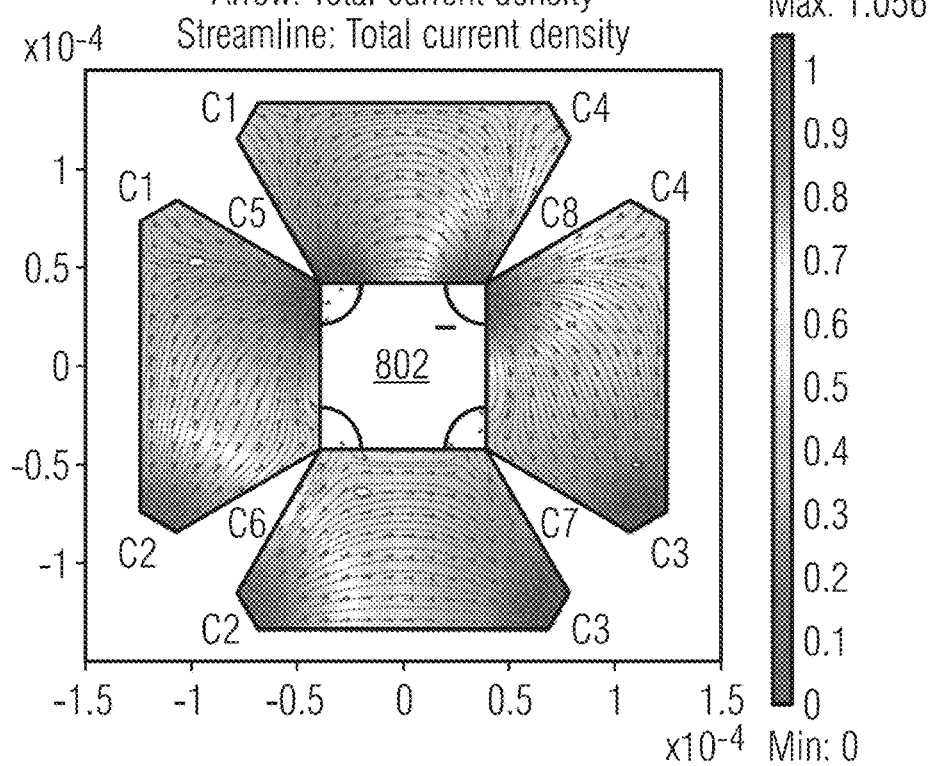
FIG. 8B illustrates a 2-dimensional representation of a potential distribution and current streamlines for one operating phase of the 3D-annular ring shell of FIG. 8A.

For comparison, FIG. 8B shows a potential distribution and current streamlines for phase 2, where the central top surface of shell 306 has been disabled in an attempt to increase the magnetic sensitivity. As can be seen, it rises by 42% to 17 mV/V/T.

| Phase no. | C1 | C2 | C3 | C4 | C5 | C6 | C7 | C8 |
|---|---|---|---|---|---|---|---|---|
| 2 | 0.47 V | 1.1 V | 0 V | 0.58 V | 0 V | 0.58 V | 0.47 V | 1.1 V |

The first type of fields (i.e., phase 2, C2; and phase 2, C8) denote contacts, where current is injected (316 µA per contact) and the second type of fields (i.e., phase 2, C3; and phase 2, phase 5) mean that this contact is grounded.

Referring to FIGS. 9A and 9B, another possible arrangement for By-measurement can short C1-C2, C3-C4, C5-C6, C7-C8. Then current can be injected into C1-C2 (terminal T12) while C7-C8 (terminal T78) is grounded. Thus current flows diagonally through the lower and upper wings and only very little current is wasted (i.e. flows through the other faces): Phases 5 and 6

| Phase no. | C1 | C2 | C3 | C4 | C5 | C6 | C7 | C8 |
|---|---|---|---|---|---|---|---|---|
| 5 | 1.64 V 163 µA | 1.64 V 163 µA | 0.36 V | 0.36 V | 0.95 V | 0.95 V | 0 | 0 |
| 6 | 1.28 V | 1.28 V | 0 | 0 | 1.64 V 163 µA | 1.64 V 163 µA | 0.69 V | 0.69 V |

The first type of fields include fields at phase 5, C1; phase 5, C2; phase 6, C5; and phase 6, C6, and the second type of fields include fields at phase 5, C7; phase 5, C8; phase 6, C3; and phase 6, C4.

Magnetic sensitivity against By-fields: −30.1 mV/V/T (no sensitivity against Bx and Bz)—and this sensitivity can again be increased if we disable the top surface.

The spinning current cancellation also works, if we combine the output signals of phases 5 and 6. However, this particular connection of contacts can detect only Bx-fields, no By- and Bz-fields. Additional devices for By, Bz-fields would be helpful. If the device inclusively its connections between contacts and terminals is rotated by 90° around the z-axis the output signals would be responsive to By- instead of Bx-field.

In some embodiments, we could think of switches, e.g. MOS-FET switches, that short the contacts or connect several contacts to a single terminal. The switches may be reconfigurable to detect Bx- and By-fields. Thus, a Hall sensor device according to an embodiment may further comprise a plurality of switches, wherein each switch is configured to selectively short a pair of contacts of the Hall effect region 104, 304. Since the switches might have non-vanishing Rds-on resistance (which can add to errors in the spinning scheme), we could activate two series connected switches between C1 and C2 to short them, but then we tap their mid-point to inject current or tap voltage there. In this way the resistance between C1-C2 is roughly constant during the spinning cycle and does not add residual offset. Unfortunately this is not true in a strict sense, because the channels of the MOS-FETs are at different common mode potential during the spinning—however, we could lift up their bulks to reduce this back-bias effect.

FIGS. 10A-10F illustrate some other example shapes of 3D-shells:

FIG. 10A shows an inverted pyramid-shell (without truncation). The contacts C1, C2, C3, C4 are at the top surface of a substrate, the pyramid can be etched into the substrate and a thin shell can be made which covers the accessible top-surfaces of the pyramid, e.g. by implanting a thin layer into the exposed substrate or by growing a thin layer above the exposed surfaces. Then the bottom contact C5 can be made, which contacts the tip of the inverted pyramid-shell. Then a wire can be made which connects C5 to the top of the inverted pyramid shell to terminal T5—of course a galvanic isolation has to be introduced between the Hall effect region 1004 and the wire. For example, the inverted pyramid can be covered by a thin dielectric layer before the wire is made. The right portion of FIG. 10A is identical to the left one, but half of the device is cut away to give view to the cross sections of the wire and the contact C5.

If the substrate, into which the inverted pyramid is grown, is toppled upside down and then taken away the Hall effect region 1004 would look like the left portion of FIG. 10B. The right portion of FIG. 10B shows the inverted pyramid shell Hall-effect region 1004 located in its surrounding substrate:

Of course the interior of the inverted pyramid-shell can be filled with some inactive medium, for example some insulating material like mold compound, glob top, plastic or by some insulating material which is isolated from the main part of the Hall-effect region—then it can be made from poly-silicon and it can be connected by a single point to some reference potential or to one of the contacts C1 . . . C5, so that no current flows through it. For conventional Hall plates it is general practice to cover the exposed face of the Hall-plate by some electric shield: in some cases this is a shallow p-tub (whereas the Hall-plate is a n-doped top) whose potential is tied low enough to be isolated against the Hall-effect region. In other cases this is a poly-silicon plate or a metal plate, which is isolated against the Hall-effect region by some non-conducting interstitial layer (like oxide or nitride layers). In all cases these electric shields are electrically conducting and their potential is tied to some reference potential. Their purpose is to protect the Hall-effect region from electric fields, which might exert forces on trapped charges in the interface layers nearby the Hall plates and this might cause a long-term drift of magnetic sensitivity of the Hall plates. Of course, similar techniques can be applied to non-planar Hall-effect devices: to this end one can cover the exposed surfaces of the device with electric shields similar to prior art—the only difference is that the shields are also non-planar. In some cases it may be even necessary to apply shields on both sides of the 3D-Hall shell, i.e. inside and outside. Sometimes, these shields may also be bulky instead of sheet like, particularly if we consider shields inside the 3D-Hall shells. In this sense the device of FIG. 1A may be n-doped and its interior may be filled with a p-doped material tied to low potential. Then the p-doped filler acts as a shield against electric field reaching from the lower side into the 3D-Hall-shell region.

FIG. 10C shows a Hall-effect region in the form of a pyramid-shell. The 3D-view is illustrated at the left hand side, the right hand side shows a cut through half of the structure: note that the wire from C5 is not touching the Hall-effect region: there is some insulating layer in-between so that the wire is electrically isolated against the Hall-effect region except for the contact C5.

Figure 10E:
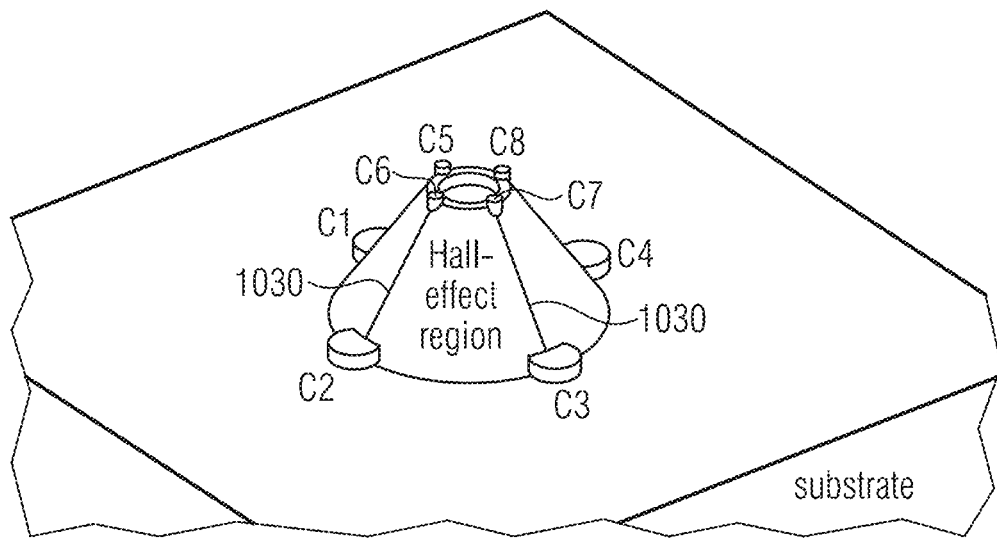

FIGS. 10D and 10E show a Hall-effect region in the shape of a truncated cone-shell with eight contacts. The wires of the top four contacts C5, C6, C7, C8 running down to the top surface of the substrate, where the contacts C1, C2, C3, C4 are located, are not shown. The right portion of FIG. 10D shows again a cross-section that shows that the Hall-effect region is a hollow, thus being a shell. The interior of the shell can be filled with substrate material or with other inert material, whereby inert means that this material must not have any notable effect on the current density distribution inside the Hall-shell region. So this material must not short different regions of the Hall-shell region, neither neighboring regions nor distant (e.g. opposite) regions of the Hall-shell region. Inert also means that this material must not have a relative magnetic permeability outside the range 0.5 to 2, because then it would divert the magnetic fluxlines (like a flux concentrator) and this would disturb a detection of various components of the magnetic field.

One important aspect is that four contacts C2, C3, C7, C6 can be regarded as vertices of a face which is bounded by the connecting lines 1030 in FIGS. 10D and 10E, and which is NOT plane, but slightly curved. Because the curvature is small, the effective properties of this structure is very similar to a truncated pyramid shell as discussed above. Note that the truncated cone shell also comprises one plane face, which is the top circle bounded by the contacts C5, C6, C7, C8—so this example shell has curved and plane faces: the curved faces can be used to detect Bx- and By-field components, but they can also be combined in a way to detect Bz-field components, while the plane face on the top can only be used to detect Bz-field component. The structure can be modified to become an annular ring shell, when we cut out the top surface like shown in FIG. 10E.

Figure 10F:
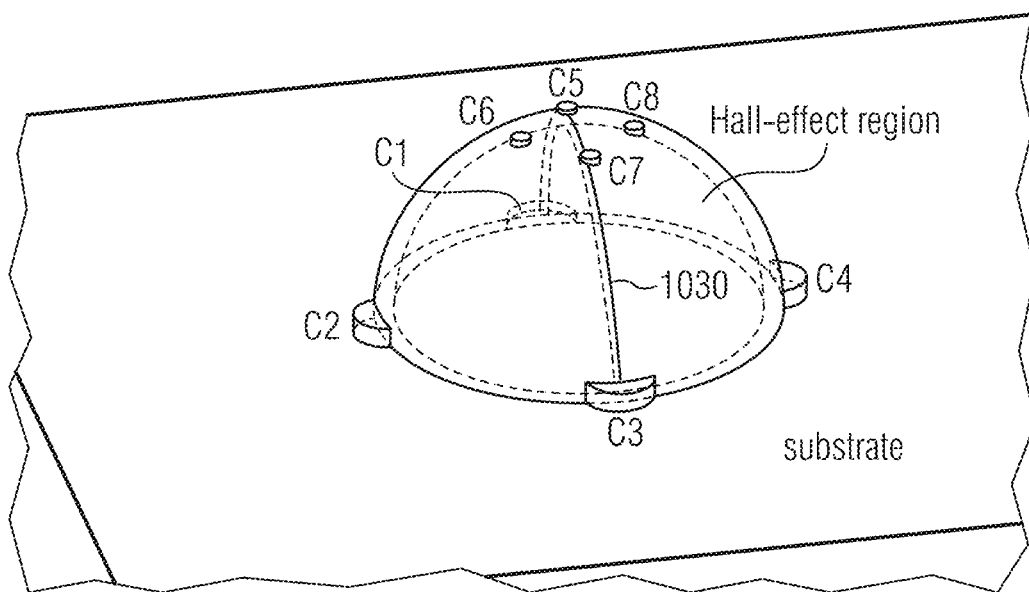

FIG. 10F shows Hall-effect region in the shape of a half-spherical shell with eight contacts in transparent view: This structure has only curved faces between any four neighboring contacts, yet it is obvious that we can compare any of these curved faces with a plane face in the explained truncated pyramid shell. Thus, according to some embodiments, the Hall-effect region can be regarded as bowl-shaped.

FIGS. 10A-10F also illustrate that the at least three contacts of the shell-like Hall-effect region are located at different heights of the shell. While some contacts can be located in the bottom portion, others can be located in the top portion. In other words, the contacts need not all be in the same plane parallel to a main surface of the substrate on or in which the shell structure is formed.

To summarize, the present disclosure relates to 3-dimensional Hall sensor devices comprising a Hall sensor element having a Hall effect region implemented in a 3-dimensional shell and comprising at least three terminals. Each terminal is connected to at least one electrical contact of the Hall effect region and each electrical contact is disposed at a different region of the 3-dimensional shell. The present disclosure further discloses spinning current/voltage schemes for offset cancellation in such 3-dimensional Hall sensor devices.

Figure 11:
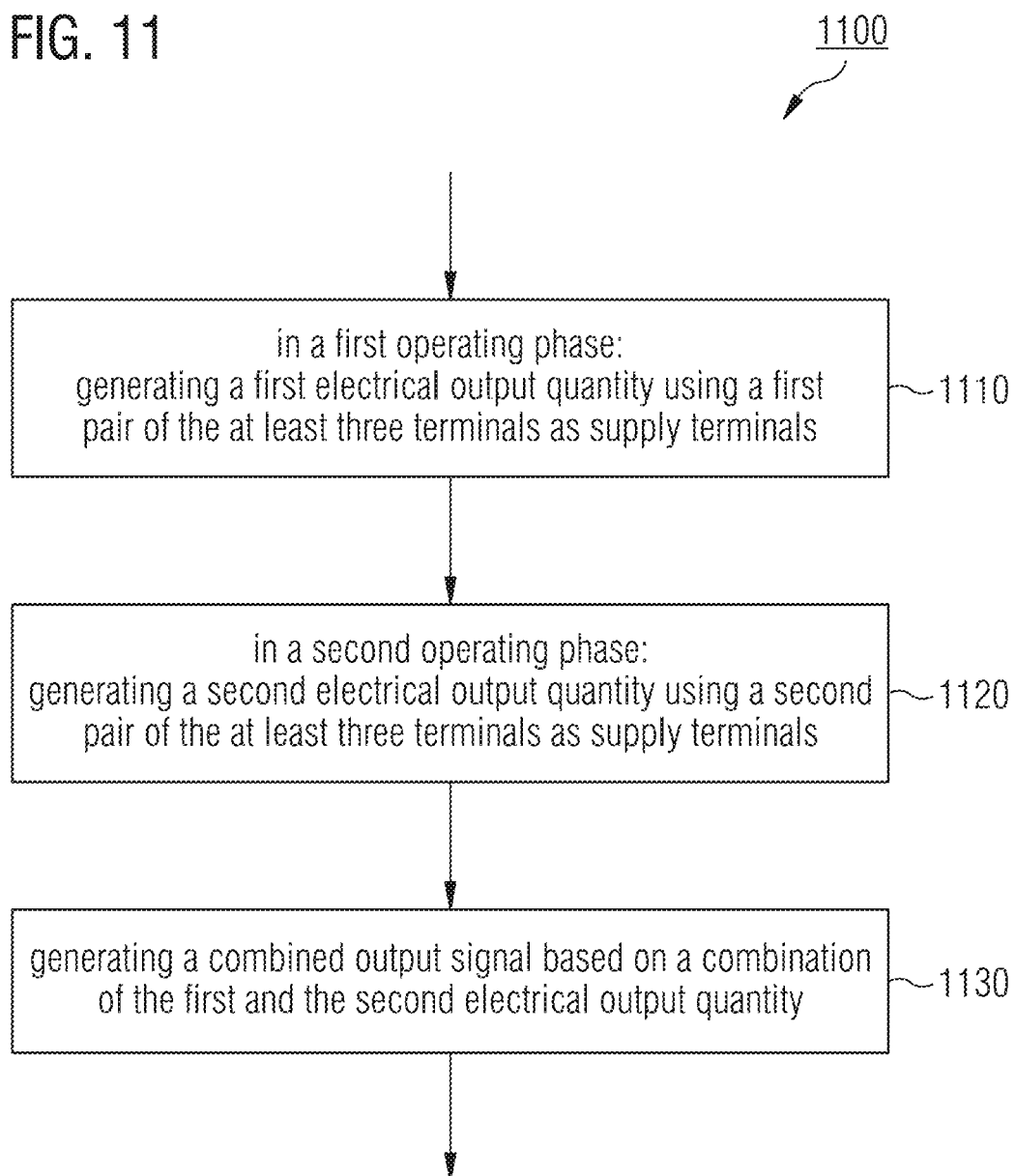
FIG. 11 illustrates a flowchart of a Hall sensing method according to an example.

In a Hall sensing method 1100 (see FIG. 11) for a Hall effect region integrated in a 3-dimensional shell, at least three terminals are coupled to the Hall effect region. Each terminal is connected to at least one electrical contact of the Hall effect region. Each electrical contact is disposed at a different region of the 3-dimensional shell. Method 1100 includes generating 1110 a first electrical output quantity using a first pair of the at least three terminals as supply terminals in a first operating phase, and generating 1120 a second electrical output quantity using a second pair of the at least three terminals as supply terminals in a second operating phase. The method further includes generating 1130 a combined output signal based on a combination of the first and the second electrical output quantity.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A Hall sensor device comprising:
   a Hall sensor element comprising:
      a Hall effect region in a three-dimensional shell and comprising four terminals and four electrical contacts,
         wherein each terminal, of the four terminals, is connected to a respective electrical contact of the four electrical contacts,
         wherein each electrical contact, of the four electrical contacts, is disposed at a different region of the three-dimensional shell, and
         wherein the three-dimensional shell is an annular ring shell without a base plate and a top plate.

2. The Hall sensor device of claim 1, wherein the annular ring shell includes four walls.

3. The Hall sensor device of claim 1, wherein each of the four electrical contacts are disposed on multiple faces at a different vertex of the three-dimensional shell.

4. The Hall sensor device of claim 1, wherein the four electrical contacts are arranged symmetrically on the three-dimensional shell with respect to a symmetry axis.

5. The Hall sensor device of claim 1, further comprising:
   a sensor circuit coupled to the four terminals and configured to operate the Hall sensor element in at least two operating phases,
      wherein the sensor circuit is configured to generate a first electrical output quantity using a first pair of the four terminals as supply terminals in a first operating phase and to generate a second electrical output quantity using a second pair of the four terminals as supply terminals in a second operating phase; and
   a combination circuit configured to combine the first electrical output quantity and the second electrical output quantity.

6. The Hall sensor device of claim 5, wherein the combination circuit is configured to generate a combined output signal based on a sum of the first electrical output quantity and the second electrical output quantity.

7. The Hall sensor device of claim 5, wherein the sensor circuit is further configured to:
   in the first operating phase, apply an electrical supply quantity via the first pair of the four terminals to ground the second pair of the four terminals to measure a first electrical output quantity at the first pair of the four terminals, and
   in the second operating phase, apply the electrical supply quantity via the second pair of the four terminals to ground the first pair of the four terminals to measure a second electrical output quantity at the second pair of the four terminals, wherein the combination circuit is configured to combine the first electrical output quantity and the second electrical output quantity.

8. The Hall sensor device of claim 5, wherein the sensor circuit is configured to:
   in the first operating phase, inject a supply current, via a first terminal of the four terminals, to inject the supply current, via a second terminal of the four terminals, to ground a third terminal of the four terminals to measure a first output voltage between the first terminal and the second terminal based on the injected supply current,
   in the second operating phase, to inject the supply current, via the second terminal of the four terminals, to inject the supply current, via the third terminal of the four terminals, to ground the first terminal of the four terminals to measure a second output voltage between the second terminal and the third terminal based on the injected supply current, and
   in a third operating phase, to inject the supply current, via the third terminal of the four terminals, to inject the supply current, via the first terminal of the four terminals, to ground the second terminal of the four terminals to measure a third output voltage between the third terminal and the first terminal based on the respective injected supply currents, and
      wherein the combination circuit is configured to combine the first output voltage, the second output voltage, and the third output voltage.

9. The Hall sensor device of claim 5, wherein the sensor circuit is configured:
   in the first operating phase, to apply a supply voltage, via a first terminal of the four terminals, to apply the supply voltage, via a second terminal of the four terminals, to ground a third terminal of the four terminals to measure at least one first quantity dependent on a first current at the first terminal and a second current at the second terminal,
   in the second operating phase, to apply the supply voltage, via the second terminal of the four terminals, to apply the supply voltage, via the third terminal of the four terminals, to ground the first terminal of the four terminals to measure at least one second quantity dependent on a third current at the second terminal and a fourth current at the third terminal, and
   in a third operating phase, to apply the supply voltage, via the third terminal of the four terminals, to apply the supply voltage, via the first terminal of the four terminals, to ground the second terminal of the four terminals to measure at least one third quantity dependent on a fifth current at the third terminal and a sixth current at the first terminal,
      wherein the combination circuit is configured to combine the at least one first quantity, the at least one second quantity, and the at least one third quantity.

10. The Hall sensor device of claim 5, wherein the sensor circuit is further configured to, in the first operating phase, apply a first electrical supply quantity using a first pair of the four terminals as the supply terminals, to measure the first electrical output quantity between a second pair of the four terminals as output terminals based on the first electrical supply quantity, and
   wherein the sensor circuit is further configured to, in the second operating phase, apply a second electrical supply quantity using the second pair of the four terminals as the supply terminals, and to measure the second electrical output quantity between the first pair of the four terminals as output terminals based on the second electrical supply quantity.

11. The Hall sensor device of claim 10, wherein the four electrical contacts are each disposed at a different point of the three-dimensional shell, and
   wherein each of the four terminals is connected to a different pair of the four electrical contacts.

12. The Hall sensor device of claim 11, wherein each pair of electrical contacts, of the four electrical contacts, comprises electrical contacts disposed at opposite faces of the three-dimensional shell.

13. The Hall sensor device of claim 11, further comprising a plurality of switches,
   wherein each switch, of the plurality of switches, is configured to selectively short a pair of electrical contacts of the four electrical contacts.

14. The Hall sensor device of claim 10, wherein the sensor circuit is further configured to:
   inject an electric current into one of the supply terminals, and
   measure a voltage between the output terminals, or
   apply an electric voltage between the supply terminals and measure a short circuit current between the output terminals.

15. The Hall sensor device of claim 14, wherein the sensor circuit is further configured to:
   ground one supply terminal, of the supply terminals, while the electric current is injected into another one of the supply terminals.

16. The Hall sensor device of claim 10, wherein the sensor circuit is further configured to:
   in a third operating phase, apply a third electrical supply quantity of reversed polarity of the first electrical supply quantity using the first pair of the four terminals as supply terminals, to measure a third electrical output quantity between the second pair of the four terminals as output terminals based on the third electrical supply quantity, and
   in a fourth operating phase, apply a fourth electrical supply quantity of reversed polarity of the second electrical supply quantity using the second pair of the four terminals as supply terminals, to measure a fourth electrical output quantity between the first pair of the four terminals as output terminals based on the fourth electrical supply quantity, and
      wherein the combination circuit is further configured to generate a combined output signal based on a combination of the first electrical output quantity, the second electrical output quantity, the third electrical output quantity, and the fourth electrical output quantity.

17. The Hall sensor device of claim 16, wherein the combination circuit is further configured to:
   generate the combined output signal based on a combination based on a first sum, of the first electrical output quantity and the second electrical output quantity, and a second sum of the third electrical output quantity and the fourth electrical output quantity.

18. A Hall sensing method for a Hall effect region integrated in a three-dimensional shell and coupled to four terminals, each terminal, of the four terminals, being connected to a respective electrical contact of four electrical contacts, each electrical contact, of the four electrical contacts, being disposed at a different region of the three-dimensional shell, the method comprising:

generating, in a first operating phase, a first electrical output quantity using a first pair of the four terminals as supply terminals;

generating, in a second operating phase, a second electrical output quantity using a second pair of the four terminals as supply terminals; and generating a combined output signal based on a combination of the first electrical output quantity and the second electrical output quantity, wherein the three-dimensional shell is an annular ring shell without a base plate and a top plate.

19. The Hall sensing method of claim 18, wherein the first electrical output quantity and the second electrical output quantity are generated by a sensing circuit.

20. The Hall sensing method of claim 18, wherein the combined output signal is generated by a combination circuit.

* * * * *